United States Patent
Mateescu et al.

(10) Patent No.: US 9,830,219 B2
(45) Date of Patent: Nov. 28, 2017

(54) ENCODING SCHEME FOR 3D VERTICAL FLASH MEMORY

(71) Applicant: Western Digital Technologies, Inc., Irvine, CA (US)

(72) Inventors: Robert Mateescu, San Jose, CA (US); Yongjune Kim, Pittsburgh, PA (US); Zvonimir Z. Bandic, San Jose, CA (US); Seung-Hwan Song, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 14/627,580

(22) Filed: Feb. 20, 2015

(65) Prior Publication Data
US 2016/0077912 A1    Mar. 17, 2016

Related U.S. Application Data

(60) Provisional application No. 62/050,415, filed on Sep. 15, 2014.

(51) Int. Cl.
| | |
|---|---|
| *G11C 29/00* | (2006.01) |
| *G06F 11/10* | (2006.01) |
| *G11C 29/52* | (2006.01) |
| *G11C 11/56* | (2006.01) |
| *G11C 29/44* | (2006.01) |
| *G11C 16/00* | (2006.01) |
| *G11C 29/04* | (2006.01) |

(52) U.S. Cl.
CPC ...... *G06F 11/1068* (2013.01); *G06F 11/1072* (2013.01); *G11C 11/5628* (2013.01); *G11C 29/44* (2013.01); *G11C 29/52* (2013.01); *G11C 16/00* (2013.01); *G11C 2029/0409* (2013.01)

(58) Field of Classification Search
None
See application file for complete search history.

(56) References Cited

U.S. PATENT DOCUMENTS

| 7,301,818 B2 | 11/2007 | Lu et al. |
| 7,692,970 B2 | 4/2010 | Park et al. |
| | (Continued) | |

OTHER PUBLICATIONS

Miccoli, C. et al., "Resolving Discrete Emission Events: A New Perspective for Detrapping Investigation in NAND Flash Memories," Reliability Physics Symposium (IRPS), 2013 IEEE International, pp. 3B.1.1-3B.1.6 (Apr. 14-18, 2013).
(Continued)

*Primary Examiner* — M. Mujtaba Chaudry
(74) *Attorney, Agent, or Firm* — Patterson & Sheridan LLP

(57) ABSTRACT

Techniques for encoding data for non-volatile memory storage systems are disclosed. In one particular embodiment, the techniques may be realized as a method including writing first data to the memory, reading the first data from the memory, analyzing the first read data such that the analyzing includes determining whether the read data includes an error, encoding second data based on the analyzing of the first data such that the second data is encoded to be written to a position adjacent to the error when it is determined that the read data includes the error, and writing the encoded second data to the memory at the position.

16 Claims, 22 Drawing Sheets

(56) References Cited

U.S. PATENT DOCUMENTS

| | | | |
|---|---|---|---|
| 8,174,887 B2 | 5/2012 | Roohparvar | |
| 9,455,048 B2* | 9/2016 | Berckmann | G11C 29/88 |
| 2002/0054507 A1* | 5/2002 | Makuta | G11C 29/789 |
| | | | 365/185.09 |
| 2003/0016560 A1* | 1/2003 | Kawamura | G11C 16/0483 |
| | | | 365/185.28 |
| 2003/0081464 A1* | 5/2003 | Vlasenko | G11C 15/00 |
| | | | 365/200 |
| 2006/0028900 A1* | 2/2006 | Shin | G11C 7/18 |
| | | | 365/230.06 |
| 2007/0211534 A1 | 9/2007 | Visconti et al. | |
| 2008/0253014 A1* | 10/2008 | Isono | G11B 20/10527 |
| | | | 360/72.2 |
| 2010/0128509 A1* | 5/2010 | Kim | G11O 5/02 |
| | | | 365/63 |
| 2010/0223530 A1* | 9/2010 | Son | G06F 11/1072 |
| | | | 714/763 |
| 2011/0044113 A1 | 2/2011 | Kim et al. | |
| 2013/0038961 A1* | 2/2013 | Song | G11B 20/1258 |
| | | | 360/49 |
| 2014/0219033 A1* | 8/2014 | Lee | G11C 11/56 |
| | | | 365/185.19 |
| 2015/0194219 A1* | 7/2015 | Asadi | G11C 16/3422 |
| | | | 702/65 |
| 2015/0364205 A1* | 12/2015 | Chen | G11C 16/3427 |
| | | | 711/155 |

OTHER PUBLICATIONS

Yeh, C. C. et al., "Novel operation schemes to improve device reliability in a localized trapping storage SONOS-type flash memory," IEEE International Electron Devices Meeting, IDEM '03 Technical Digest, pp. 7.5.1-7.5.4 (Dec. 8-10, 2003).

* cited by examiner (a) Single-level cell (SLC) for $B = 1$ (b) Multi-level cell (MLC) for $B = 2$

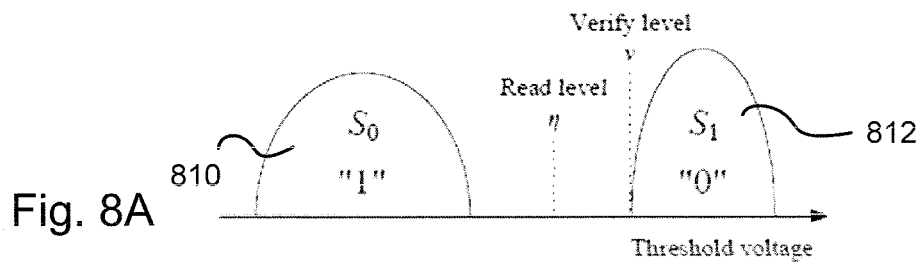
(a) Threshold voltage distribution of cells in the $i$-th WL before fast detrapping
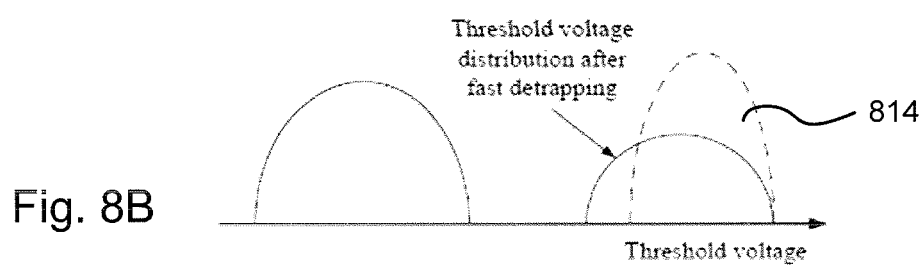
(b) Threshold voltage distribution of cells in the $i$-th WL after fast detrapping
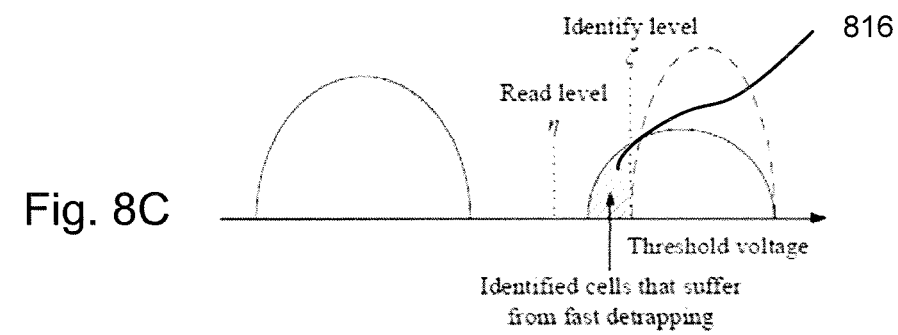
(c) Identified cells that suffer from fast detrapping in the $i$-th WL

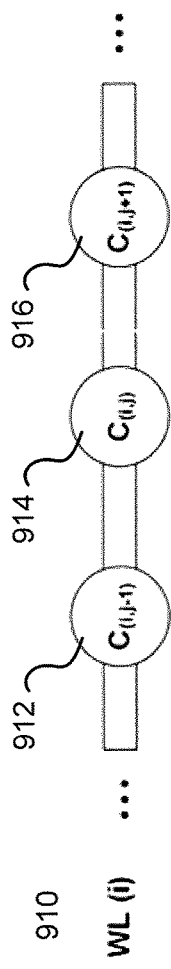
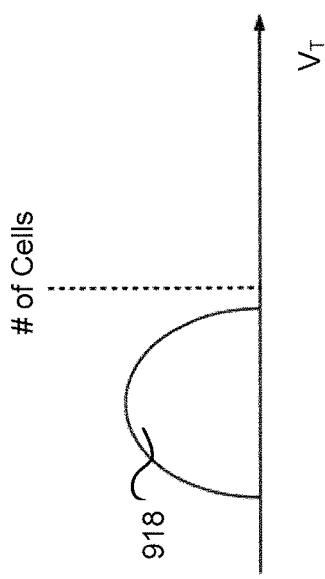
Fig. 9A
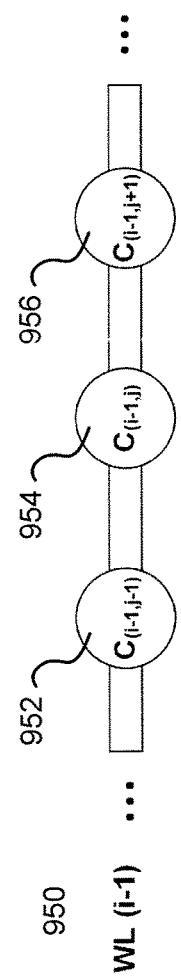
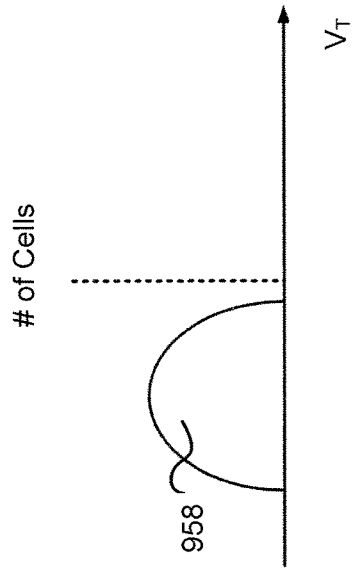
Fig. 9B

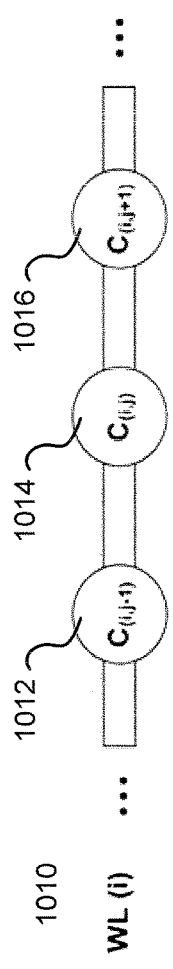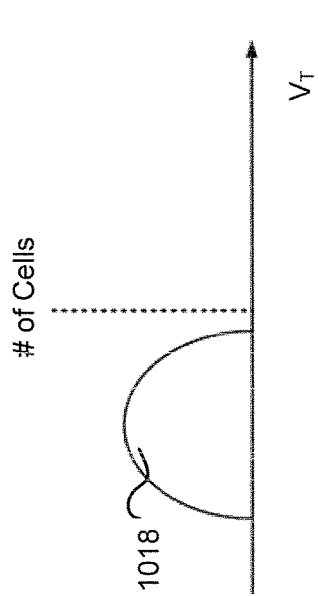
Fig. 10A
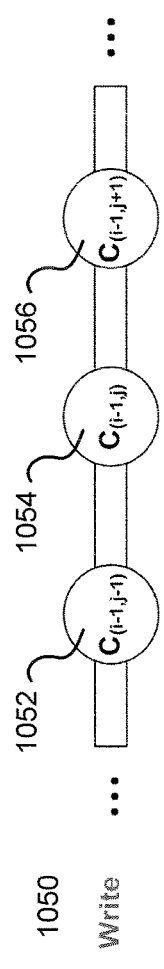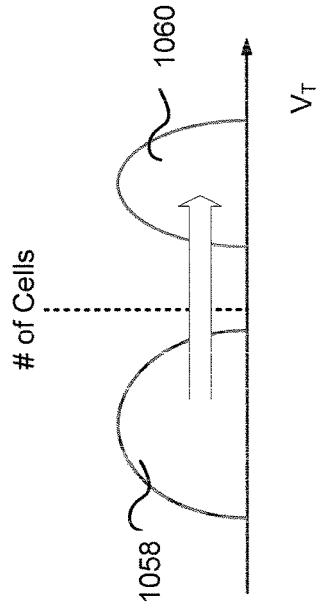
Fig. 10B

ENCODING SCHEME FOR 3D VERTICAL FLASH MEMORY

CROSS-REFERENCE PARAGRAPH

This application claims priority to U.S. Patent Application No. 62/050,415, filed on Sep. 15, 2014, the entire contents of which are herein incorporated by reference.

BACKGROUND

Non-volatile memory storage systems are a type of memory commonly used in computer systems. Non-volatile memory such as solid state drives and hard drives provide particular benefits including, for example, the ability to store data with high data access and throughput rates. However, a problem associated with non-volatile memory (NVM) is the phenomenon of detrapping which results in threshold voltage variations in programmed cells and errors. In particular, fast detrapping caused by electrons trapped in charge trap layers of memory cells tunneling out after programming causes errors in memory. This phenomenon and associated errors are particularly problematic in three-dimensional vertical flash memory. Traditional methods of addressing detrapping in part focus on cell structure engineering. However, these traditional techniques generally do not sufficiently compensate for this phenomenon which leads to increased errors.

SUMMARY OF THE DISCLOSURE

Techniques for encoding data for writing to a nonvolatile memory storage subsystem are disclosed. In one aspect, the present disclosure relates to a method of encoding data for writing to a memory comprising: writing first data to the memory; reading the first data from the memory; analyzing the first read data, wherein the analyzing comprises determining whether the read data includes an error; encoding second data based on the analyzing of the first data, wherein the second data is encoded to be written to a position adjacent to the error when it is determined that the read data includes the error; and writing the encoded second data to the memory at the position.

In some embodiments of the present disclosure, the memory is a non-volatile memory storage system.

In accordance with further aspects of this embodiment, the non-volatile memory storage system is a solid state drive.

In accordance with additional aspects of this embodiment, the solid state drive is three-dimensional flash memory.

In accordance with further aspects of this embodiment, the three-dimensional flash memory comprises a plurality of word lines having single-level cells.

In accordance with additional aspects of this embodiment, the reading comprises reading the first data from memory based on a predetermined threshold.

In accordance with additional aspects of this embodiment, the predetermined threshold is a read voltage level threshold.

In accordance with additional aspects of this embodiment, the analyzing comprises comparing the first data read from memory based on the predetermined threshold to a copy of the first data different from the first data stored in the memory.

In accordance with additional aspects of this embodiment, the analyzing comprises identifying an error position of a memory cell having the error based on the comparison, and wherein the position at which the second data is to be written is adjacent the error position of the memory cell.

In accordance with additional aspects of this embodiment, the position at which the second data is to be written is in a different word line.

In accordance with further aspects of this embodiment, the reading comprises reading the first data from memory based on a plurality of predetermined thresholds.

In accordance with other aspects of this embodiment, the analyzing comprises comparing the first data read from the memory based on a first of the plurality of predetermined thresholds and the first data read from the memory based on a second of the plurality of predetermined thresholds that is different from the first predetermined threshold.

In accordance with additional aspects of this embodiment, the analyzing comprises identifying an error position of a memory cell having the error based on the comparison.

In accordance with additional aspects of this embodiment, the three-dimensional flash memory comprises a plurality of word lines having multi-level cells.

In accordance with additional aspects of this embodiment, the position at which the second data is to be written is in one of an upper page of a first adjacent word line different from a word line containing the first data and a lower page of a second adjacent word line different from the word line containing the first data.

In accordance with other aspects of this embodiment, the encoding is performed by a flash memory controller.

In accordance with additional aspects of this embodiment, the error is caused by detrapping.

In accordance with additional aspects of this embodiment, the second data is written to memory at the position to cause inter-cell interference with the first data.

Another aspect of the present disclosure relates to a computer program product comprised of a series of instructions executable on a computer, the computer program product performing a process for encoding data for writing to a memory; the computer program implementing the steps of: writing first data to the memory; reading the first data from the memory; analyzing the read first data, wherein the analyzing comprises determining whether the read data includes an error; encoding second data based on the analyzing of the first data, wherein the second data is encoded to be written to a position adjacent to the error when it is determined that the read data includes the error; and writing the encoded second data to the memory at the position.

In some embodiments, the techniques may be realized as a computer program product comprised of a series of instructions executable on a computer, the computer program product performing a process for controlling power on a Peripheral Component Interconnect Express (PCIe) interface; the computer program implementing the steps of: writing first data to the memory; reading the first data from the memory; analyzing the read first data, wherein the analyzing comprises determining whether the read data includes an error; encoding second data based on the analyzing of the first data, wherein the second data is encoded to be written to a position adjacent to the error when it is determined that the read data includes the error; and writing the encoded second data to the memory at the position.

In some embodiments, the techniques may be realized as a system for encoding data for writing to a memory, the system comprising: a writing module that writes first data to the memory; a reading module that reads the first data from the memory; an analyzing module that analyzes the read first data, wherein the analyzing comprises determining whether the read data includes an error; an encoding module that encodes second data based on the analyzing of the first data, wherein the second data is encoded to be written to a position adjacent to the error when it is determined that the read data includes the error; and an encoded data writing module that writes the encoded second data to the memory at the position.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 8A-C depict examples of changes in threshold voltage distributions over time caused by writing data to memory cells in accordance with an embodiment of the present disclosure.

FIGS. 9A and 9B depict another example of threshold voltage distributions of memory cells in accordance with an embodiment of the present disclosure.

FIGS. 10A and 10B depict an example of threshold voltage distributions of memory cells in accordance with an embodiment of the present disclosure.

DESCRIPTION

The present disclosure generally relates to encoding data to be written to a non-volatile memory. In one aspect of the present disclosure, the encoding of data may take into account the phenomena known as detrapping and inter-cell interference (ICI). One type of detrapping is fast detrapping caused by electrons trapped in charge trap layers of memory cells tunneling out after programming. Inter-cell interference (ICI) is a parasitic capacitance coupling between adjacent memory cells impacting threshold voltages. In certain aspects of the present disclosure, memory cells suffering from detrapping may be identified and subsequent data may be written to memory such that inter-cell interference (ICI) is intentionally caused between the memory cells suffering from detrapping and the memory cells storing the new data. Accordingly, errors caused by detrapping may be reduced.

Figure 1:
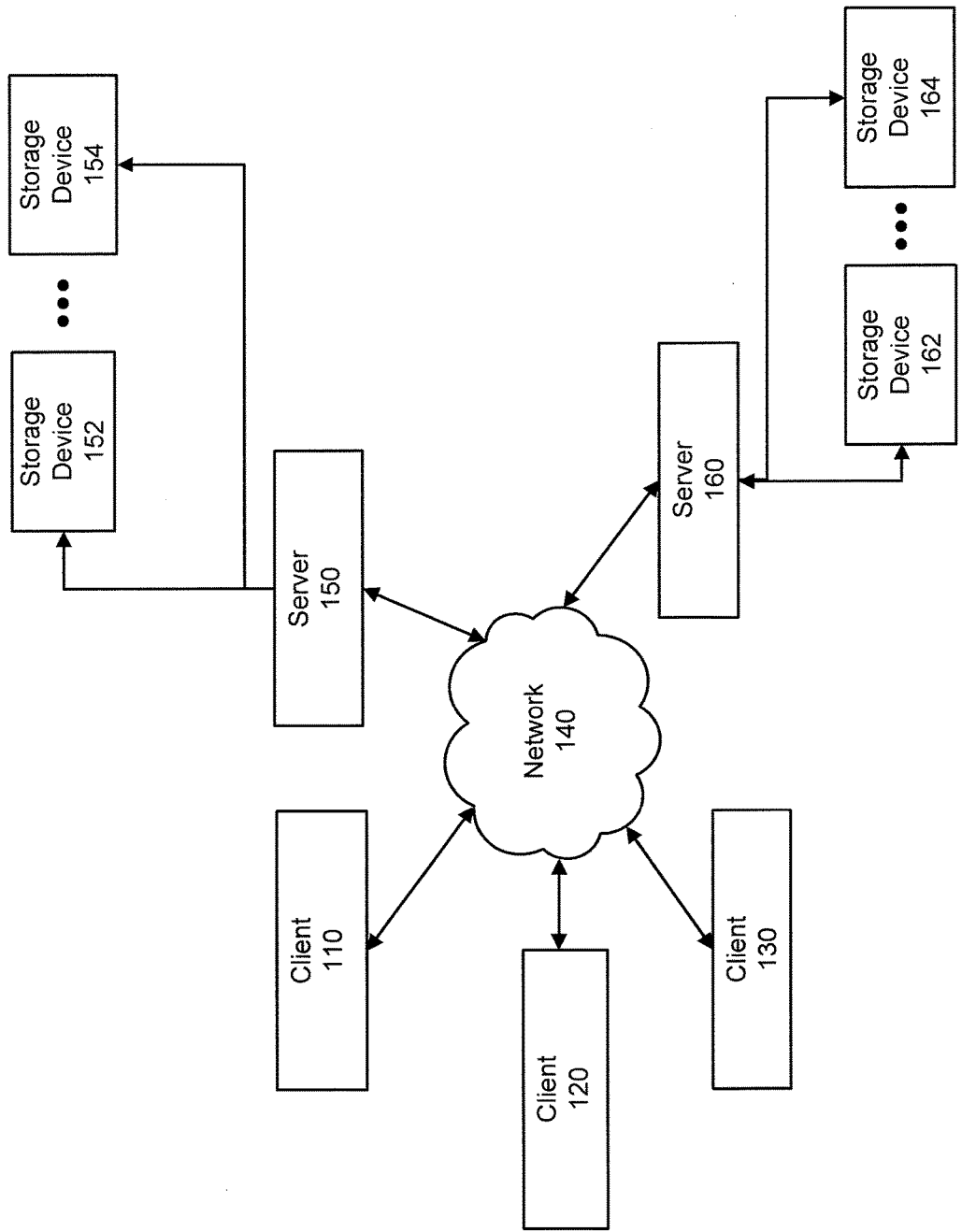
FIG. 1 shows a block diagram depicting a computing architecture in accordance with an embodiment of the present disclosure.

FIG. 1 shows a block diagram depicting a computing architecture 100 in accordance with an embodiment of the present disclosure. The computing architecture 100 may include additional elements that are not depicted. Computing architecture 100 may contain client computing systems 110, 120 and 130, as well as servers 150 and 160. The client computing systems 110, 120 and 130, as well as the servers 150 and 160 may implement the computing system 200 shown in FIG. 2. Each of the clients 110-130 and the servers 150-160 may be communicatively coupled to a network 140. Server 150 may be connected to a plurality of storage devices 152 thru 154. Clients 110-130 may also be connected to a plurality of storage devices (not shown). Server 160 may be connected to a plurality of storage devices 162 thru 164. Although only two storage devices are illustrated as being coupled to the servers 150 and 160, additional storage devices may be provided. In some instances, the storage devices 152, 154, 162, and 164 may be non-volatile memory storage systems. For example, the storage devices 152, 154, 162, and 164 may be solid-state memory (e.g., flash memory, NAND flash, etc.), optical memory, or magnetic memory.

Figure 2:
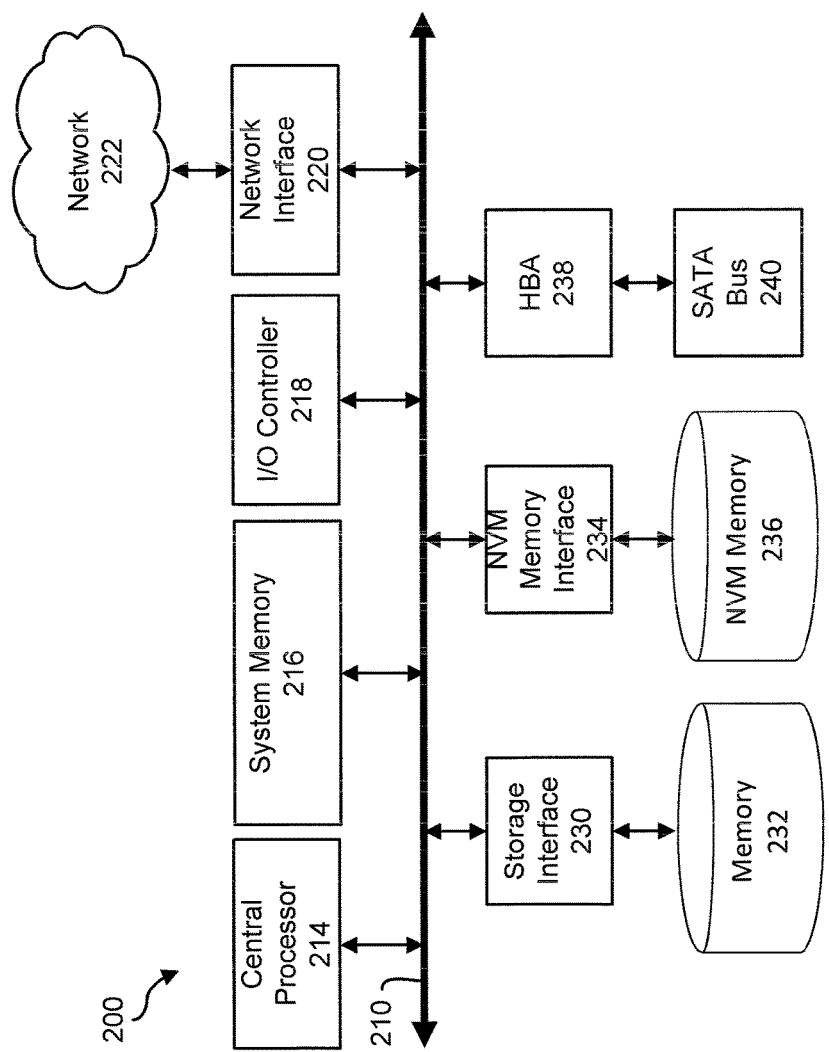
FIG. 2 shows a block diagram depicting a computer system in accordance with an embodiment of the present disclosure.

FIG. 2 shows a block diagram depicting a computer system 200 in accordance with an embodiment of the present disclosure. The computer system 200 may contain a bus 210 connecting subsystems of computer system 200 including a central processor 214, a system memory 216 (e.g., RAM (Random Access Memory), ROM (Read Only Memory), flash RAM, etc.), an Input/Output (I/O) controller 218, and a network interface 220. The network interface 200 may communicatively couple the computer system 200 to a network 222 (e.g., a local area network, wide area network, the internet, etc.). The bus 210 may also connect a storage interface 230 to memory 232, a non-volatile memory interface 234 to non-volatile memory 236, and a host bus adapter (HBA) to a serial ATA (SATA) bus 240. The SATA bus 240 may connect the computer system 200 to additional storage systems. The computer system 200 may contain additional devices or subsystems not illustrated.

Figure 3:
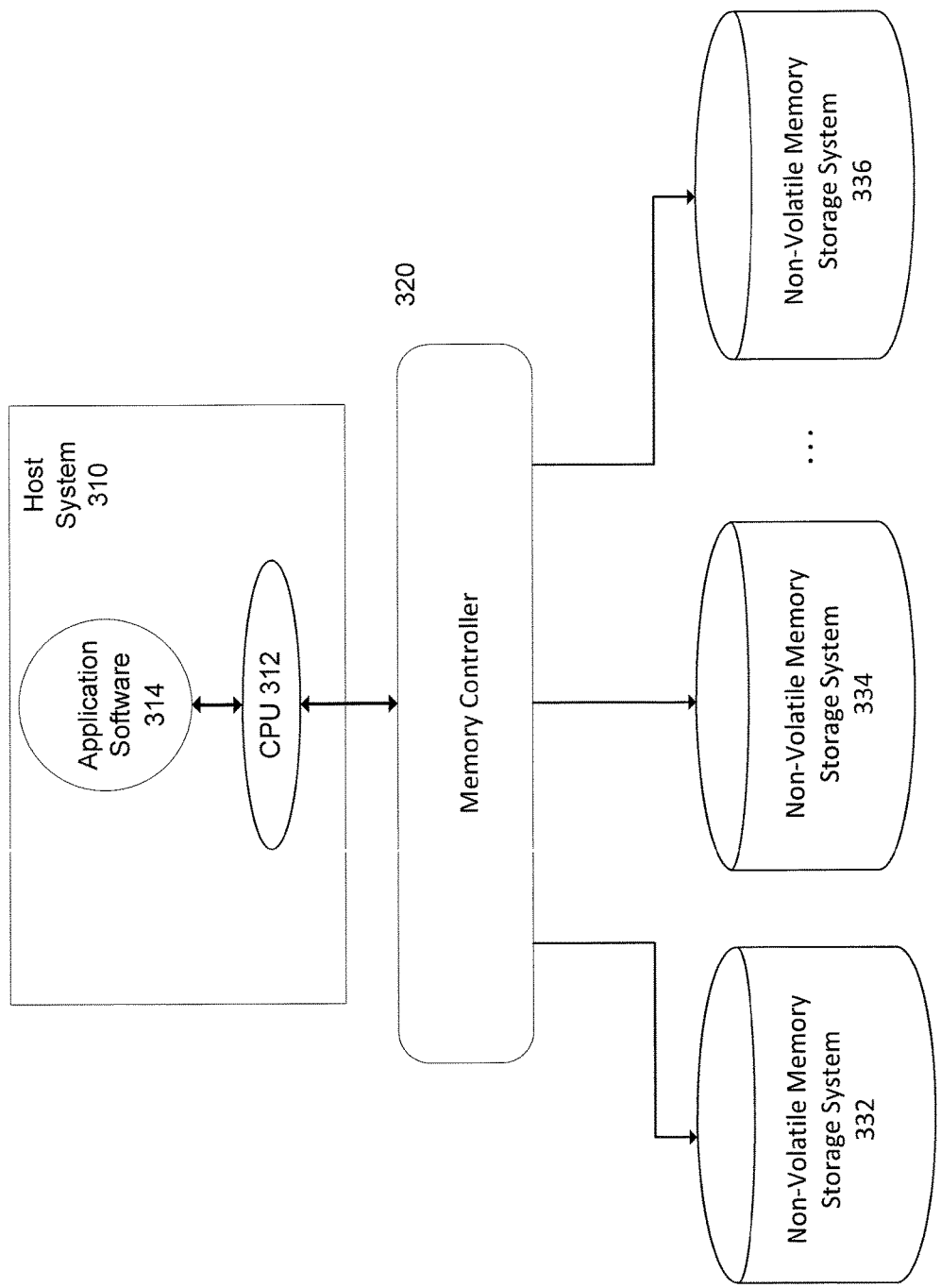
FIG. 3 shows an exemplary block diagram depicting a non-volatile storage system in accordance with an embodiment of the present disclosure.

FIG. 3 shows a block diagram depicting a non-volatile memory storage system 300 in accordance with an embodiment of the present disclosure. The non-volatile memory storage system 300 may include a host system 310, a memory controller 320, and non-volatile memory storage systems 332-336. The non-volatile memory storage system 300 may be implemented on any one of the clients 110-130 and the servers 150 and 160. For example, any one of the clients 110-130 and the servers 150 and 160 may be the host system 320 having at least one CPU 312 implementing application software 314. In some instances, the host system 310 may execute application software 314 on at least one CPU 312 to execute operations on the non-volatile memory storage systems 332-336 via the memory controller 320.

The application software 310 may be any applicable software for executing operations (read, write, erase, control operations, etc.) on the non-volatile memory storage system 300. For example, the application software 310 may read or write data stored on any one of the non-volatile memory (NVM) storage systems 332-336. The application software 310 may implement the operations on the NVM storage systems 332-336 via the memory controller 320.

The memory controller 320 shown in FIG. 3 may be a memory controller for implementing operations on the attached NVM storage systems 332-336. In particular, the memory controller 320 may provide processors (e.g., CPU 312) implementing the application software 314 access to the NVM storage systems 332-336. In some instances, the memory controller 320 may be implemented on each of the NVM storage systems 332-336 or as part of a separate computer system (e.g., server 150). In other instances, a single memory controller may be provided to control the NVM storage systems 332-336. The controller 320 may provide buffers or queues to temporarily store operations to be implemented on the NVM storage systems 332-336. The controller 320 may also encode data to be written to the NVM storage systems 332-336.

Figure 4:
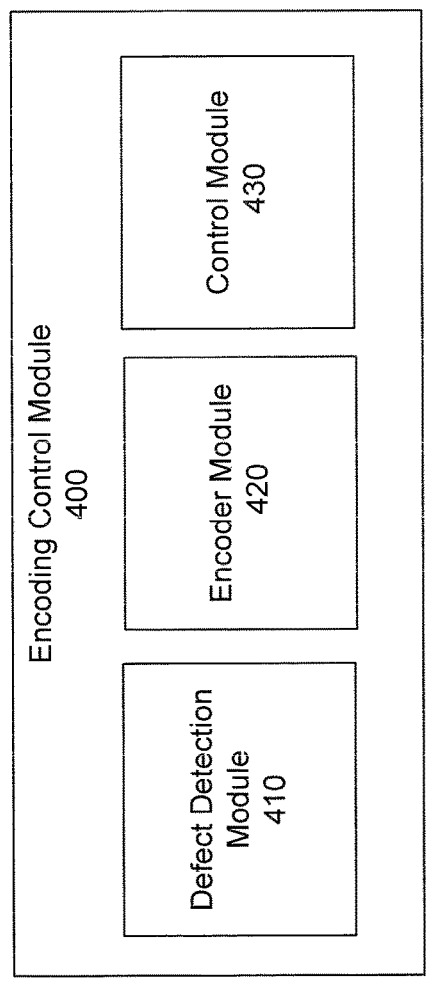
FIG. 4 depicts a block diagram depicting an encoding control module in accordance with an embodiment of the present disclosure.

FIG. 4 shows an encoding control module 400 in accordance with an embodiment of the present disclosure. As illustrated, the encoding control module 400 may contain one or more components including a defect detection module 410, an encoder module 420, and a control module 430.

The defect detection module 410 may detect defects within a NVM storage system. For example, the defect detection module 410 may detect defects within a NVM storage system such as NVM storage systems 332-336. In some embodiments, the defect detection module 410 may detect defects in a NVM storage system by reading data from the NVM storage system following a write of data to the NVM storage system. In some instances, the data may be read back from the NVM immediately after writing. This defect information can then be provided to the encoder module 420 to compensate for any defects or errors when writing new data to the NVM storage system.

In some embodiments, the detection module 410 may determine defects in the NVM storage system caused by detrapping. Detrapping is caused by trapped electrons in charge trap layers tunneling out after programming of the memory cell. As a result of the detrapping, charge is lost and the threshold voltage of the corresponding memory cells degrade the threshold voltage distribution. This is described and shown in further detail below. Detrapping generally occurs immediately after a write operation is performed and saturates within a about second. To determine defects caused by detrapping, the defect detection module 410 may read data from the NVM subsequent to writing the data using a predetermined voltage threshold ($V_T$) and compare the read data to the information having been previously written. Alternatively, the module 410 may read the data based on multiple voltage thresholds and compare the results. Based on this comparison, memory cells and their corresponding locations (e.g., word line, bit line, and string-select-line) suffering from detrapping may be identified.

The encoder module 420 may encode data to be written to a NVM storage system based on a predetermined algorithm. In some instances, the encoder module 420 may receive defect information from the defect detection module 410 and incorporate this information when encoding the data to be written to the NVM storage system. For instance, the encoder module 420 may encode and map the cell locations of the data to be written to the NVM to take into account the memory cells suffering from detrapping. In some embodiments, the encoder module 420 may also take into account inter-cell interference when encoding the data to be written. For example, the encoder module 420 may encode the data to be written such that it is intentionally stored at a location on the memory near the memory cell suffering from detrapping to intentionally cause inter-cell interference. As a result of encoding and writing the data to the location near the memory cell suffering detrapping, charge may be injected into the memory cell suffering from detrapping to increase their threshold voltage caused by inter-cell interference. The encoder module 420 may provide the encoded data to the control module 430 for subsequent writing of the encoded data to the NVM memory such that when the data is written to the memory, the errors due to detrapping may be reduced.

The control module 430 may cause data to be written onto and read from a NVM storage system as well as perform additional background operations. In some embodiments, the control module 430 may receive encoded data from the encoder module 420 and cause that data to be written onto a NVM storage system (e.g., NVM storage systems 332-336). The control module 430 may also cause data to be read from a NVM storage system (e.g., NVM storage systems 332-336). For example, the control module 430 may read data from the NVM following writing of the data and provide that read data to the defect detection module 410 for detection of defects.

Figure 5:
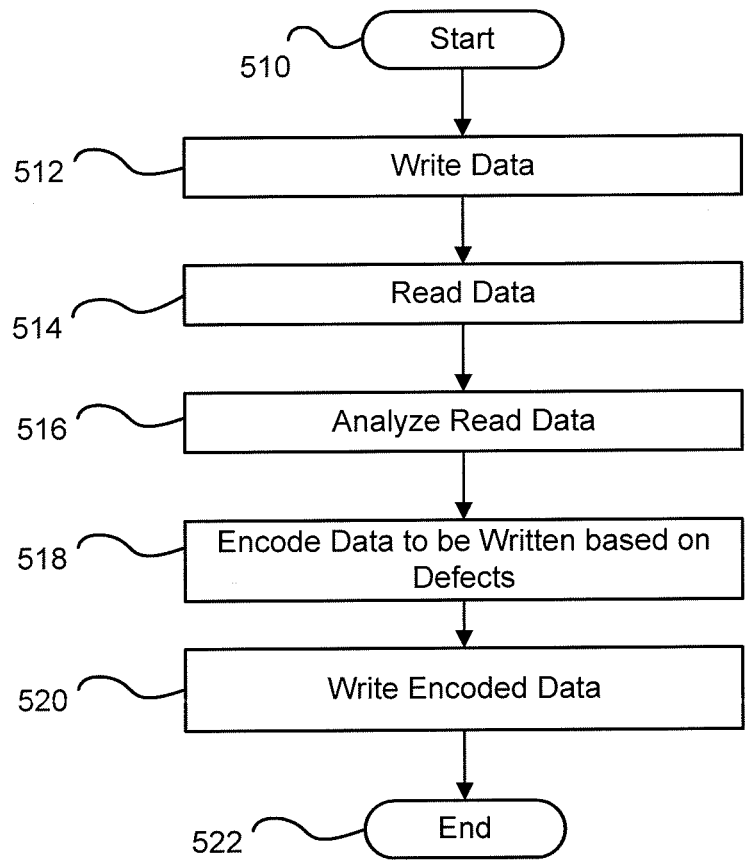
FIG. 5 depicts a flowchart illustrating a method for encoding data for non-volatile storage systems in accordance with an embodiment of the present disclosure.

FIG. 5 shows a method 500 for encoding data in accordance with an embodiment of the present disclosure. In some embodiments, the method 500 may be performed at a hardware level such as controller 320. At block 510, the method 500 may begin.

At block 512, data may be written to memory. In some embodiments, the control module 430 may cause the data to be written to memory. The data written to memory at block 512 may be user data or a predetermined data pattern. In some instances, the memory may be a NVM storage system such as NAND flash memory. An example of writing data to memory is described below with respect to FIG. 7. After the data has been written at block 512, the overall process may proceed to block 514.

At block 514, the data written at block 512 may be read from memory. In some embodiments, the control module 430 may cause the data previously written at block 512 to be read from memory (e.g., flash memory). In some instances, the control module 430 may read the data from the memory multiple times based on differing threshold values ($V_T$). The data read from memory may then be provided to defect detection module 410 for analysis. After the data has been read from memory at block 514, the overall process may proceed to block 516.

At block 516, the data read from memory at block 514 may be analyzed to determine whether there are any errors in the data and also whether there are any corresponding defects in memory cells storing the data. In some embodiments, the defect detection module 410 may analyze the read data to identify memory cells suffering from detrapping. For example, the defect detection module 410 may store the original data written at block 512 and compare the data read back from memory at block 514 to identify defective memory cells. The locations of memory cells suffering from detrapping may also be determined based on the comparison. In another example, the defect detection module 410 may use the data read from memory based on differing voltage thresholds to identify errors and memory cells suffering from detrapping. An example of this is described below with respect to FIG. 8. After the data has been analyzed at block 516, the overall process may proceed to block 518.

At block 518, new data to be written to memory may be encoded. In some embodiments, the data may be encoded by the encoder module 420. The data to be written may be encoded using the defect information determined at block 516. In particular, the encoder module 420 may determine locations of memory cells (e.g., word line, bit line, and string-select-line) and use that information when writing new data. For example, data to be written may be encoded such that the effect of detrapping in a memory cell on the i-th word line (WL) may be controlled by intentional inter-cell interference (ICI)—parasitic capacitance coupling between adjacent cells—from the (i+1)-th WL. Accordingly, the intentional ICI may compensate for a decrease in threshold value of a memory cell in the i-th WL since intentional ICI may increase the threshold voltage in an interfering cell. Examples of encoding data are described in detail below. After the new data has been encoded at block 518, the overall proceed may proceed to block 520.

At block 520, the encoded data may be written to memory. In some embodiments, the data may be written to memory (e.g., flash memory) by the control module 430. After data has been written at block 520, the overall process may proceed to block 522.

At block 522, the process may end. In some embodiments, the process may proceed back to step 510 and may be repeated periodically or continuously.

Figure 6A:
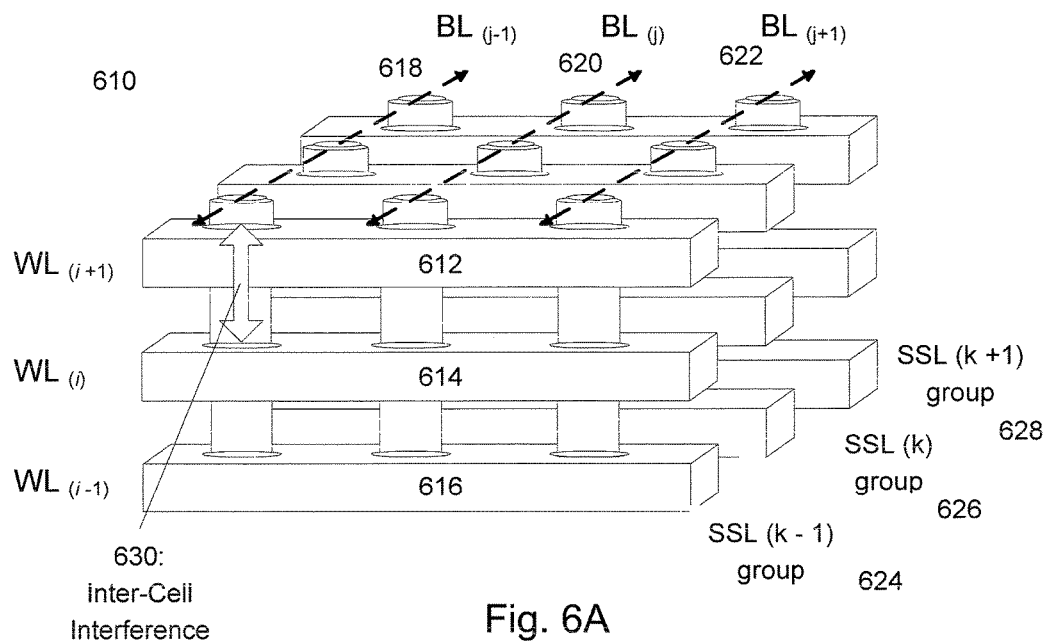
FIGS. 6A-6B depict memory cells in accordance with an embodiment of the present disclosure.
Figure 6B:
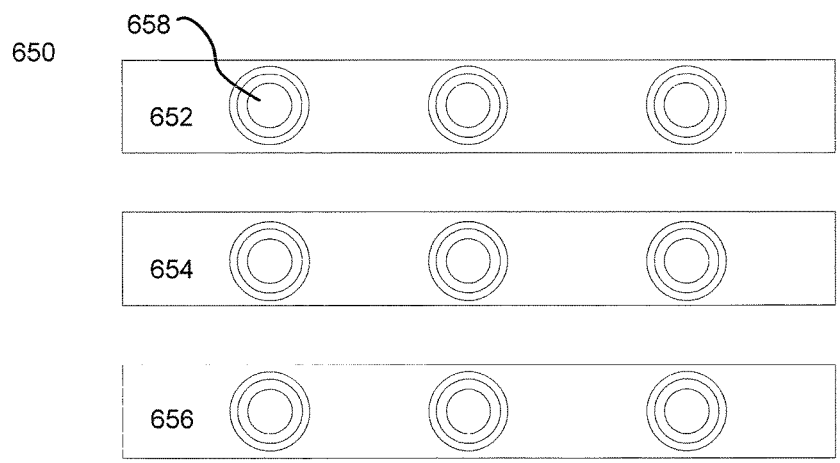

FIGS. 6A-6B show memory cells in accordance with an embodiment of the present disclosure. The memory cells shown in FIGS. 6A-6B may correspond to the memory storing the data described above with respect to FIG. 5. In particular, FIGS. 6A-6B shows memory cells located in a segment of a 3D vertical flash memory array architecture in accordance with an embodiment of the present disclosure.

FIG. 6A shows a 3D vertical flash memory array 610 having multiple planes of word lines including word lines: $WL_{(i+1)}$ 612, $WL_{(i)}$ 614, and $WL_{(i-1)}$ 616, and multiple bit lines connecting the word lines: $BL_{(j-1)}$ 618, $BL_{(j)}$ 620, and $BL_{(j+1)}$ 622. The memory cells are also arranged in string-select-line (SSL) groups: $SSL_{(k-1)}$ 624, $SSL_{(k)}$ 626, and $SSL_{(k+1)}$ 628. Additional word lines and bit lines may be present although not illustrated. FIG. 6A further illustrates an instance of inter-cell interference 630 between a memory cell in word line 612 and word line 614. FIG. 6B illustrates a cross section 650 of a word line plane having multiple word lines. For example, FIG. 6B may correspond, for example, to a cross section of the 3D vertical flash memory array 610 including $WL_{(i+1)}$ 612. The plane 650 includes multiple word lines 652, 654, and 656 each having multiple memory cells (e.g., 658). In some embodiments, the memory cells (e.g., 658) may have a nitride layer inside an oxide-nitride-oxide (ONO) stack grown as a charge trap layer along the circumference of the thin poly-silicon vertical channel and surrounded by metal gates along the WL plane.

The threshold voltage of a memory cell may correspond to the logical value (e.g., 0 or 1) stored in a memory cell. In one example, V(i,j,k) may correspond to the threshold voltage of memory cell (i, j, k). Memory cell (i, j, k) may correspond to the memory cell of the 3D vertical flash memory array 610 shown in FIG. 6A situated at the i-th WL, the j-th BL, and the k-th string-select-line (SSL) group. Inter-cell-interference (ICI) may occur with respect to adjacent memory cells due to parasitic capacitance coupling between adjacent cells. The threshold voltage shift $\Delta_{ICI}V(i,j,k)$ of the (i, j, k) cell due to the inter-cell-interference (ICI) may be calculated based on the following formula:

$$\Delta_{ICI}V(i,j,k)=\gamma WL\text{-}to\text{-}WL(\Delta V(i-1,j,k)+\Delta V(i+1,j,k))+\gamma BL\text{-}to\text{-}BL(\Delta V(i,j-1,k)+\Delta V(i,j+1,k))+\gamma SSL\text{-}to\text{-}SSL\Delta V(i,j,k-1)+\Delta V(i,j,k+1) \quad (1)$$

$\Delta V(i\pm 1,j\pm 1,k\pm 1)$ represents the threshold voltage shifts of adjacent cells after the (i,j,k) cell has been written. γWL-to-WL corresponds to the coupling ratio between WL plane and adjacent WL plane. γBL-to-BL corresponds to the coupling ratio between bit-line (BL) and adjacent BL. In addition, γSSL-to-SSL corresponds to the coupling ratio between SSL group and its adjacent SSL group.

The inter-cell-interference (ICI) between adjacent WL planes in a 3D vertical flash memory is reduced compared to the conventional 2D planar flash memory since the charge trap layer in the 3D vertical flash memory is much thinner than the floating gate layer in the 2D flash memory. However, the inter-cell-interference (ICI) between adjacent WL planes increases as the physical distance between WL planes reduces for the higher cell density. Accordingly, by setting γ=γWL-to-WL and γBL-to-BL=γSSL-to-SSL=0, the inter-cell-interference (ICI) model of (1) may be simplified into:

$$\Delta_{ICI}V(i,j,k)=\gamma(\Delta V(i-1,j,k)+\Delta V(i+1,j,k)). \quad (2)$$

This model of the inter-cell-interference (ICI) between adjacent memory cells in a 3D vertical flash memory may be utilized when encoding new data to be written to the memory to reduce errors caused by detrapping.

Figure 7A:
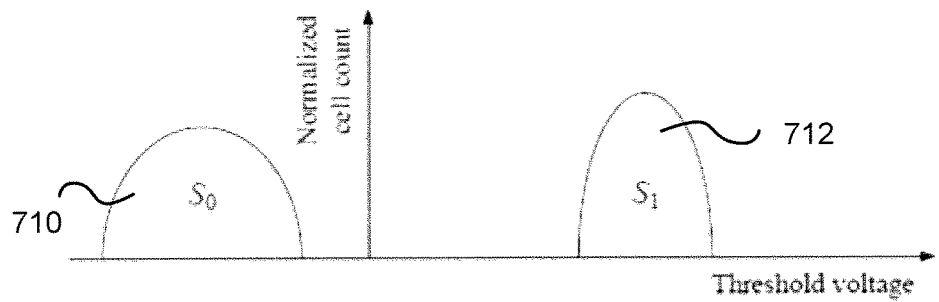
FIGS. 7A and 7B depict voltage distributions of memory cells in accordance with an embodiment of the present disclosure.
Figure 7B:
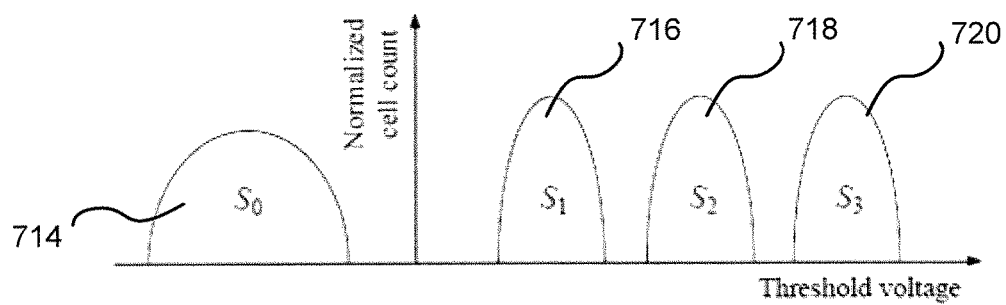

FIGS. 7A and 7B show voltage distributions of memory cells in accordance with an embodiment of the present disclosure. The voltage distributions of the memory cells shown in FIGS. 7A and 7B may correspond to writing data in block 512 of FIG. 5. In particular, FIG. 7A shows a single-level cell (SLC) for storing B-bits per cell where B=1 and corresponding threshold voltage distributions. The x-axis corresponds to the threshold voltage ($V_T$) of the memory cells and the y-axis corresponds to the number of memory cells having that threshold voltage. Initially, memory cells may be erased or unprogrammed such that their threshold voltage distribution is in a lowest state $S_0$ 710. When writing data to the memory cells, the threshold voltage of the cells are increased according to one of a plurality of writing operation schemes (e.g., incremental step pulse programming (ISPP) scheme) such that the memory cells are shifted to a programmed state 712. In this programmed state 712, the memory cells have a higher voltage distribution.

FIG. 7B shows an example of a multi-level cell (MLC) for storing B-bits per cell where B=2. In other instances, the multi-level cell (MLC) memory for storing B-bits per cell where B≥2. FIG. 7B shows the memory cells of the multi-level cell (MLC) memory initially in an erased such that their threshold voltage is in the lowest state $S_0$ 714. During writing of data to the memory cells, the threshold voltage of the memory cells are increased such that the cells are in a first programmed state 716, a second programmed state 718, and a third programmed state 720. These different programmed states may correspond to different logical values (e.g., 00, 01, 10, 11).

FIGS. 8A-C depict examples of changes in threshold voltage distributions over time caused by writing data to memory cells in accordance with an embodiment of the present disclosure. The voltage distributions of the memory cells shown in FIGS. 8A-C may correspond to writing data in block 512, reading the written data in block 514, and analyzing the read data in block 516 of FIG. 5. By measuring the threshold voltage distribution of the programmed memory cells after programming and comparing the results, memory cells suffering from detrapping may be identified.

As shown in FIG. 8A, a memory cell in word line i may be initialized in a first state $S_0$ 810 before writing data and programmed to a second state $S_1$ 812 after writing data. In this instance, the first state $S_0$ may correspond to a binary "1" while the second state may correspond to a binary "0". However, in other schemes the first state $S_0$ may correspond to a binary "0" while the second state may correspond to a binary "1." FIG. 8A further illustrates the programming of the memory cells prior to the occurrence of detrapping such that the second state $S_1$ 812 exceeds the read level η threshold voltage and the verify level threshold voltage v. The read level η threshold voltage may correspond to the voltage level used when reading the data from the memory cell while the verify level threshold voltage v may be used during programming of the memory cells into the second state $S_1$ 812. The specific voltage values of the read level η and the verify level v may differ in accordance with the particular memory design.

FIG. 8B illustrates an instance of the threshold voltage distribution of memory cells in word line i after detrapping, particularly due to fast detrapping. As shown in FIG. 8B, the threshold voltage level distribution 814 in the memory cells on word line i after programming may degrade such that the number of memory cells having the appropriate voltage becomes less due to fast detrapping. Not all memory cells suffer from the same amount of detrapping and the amount of detrapping may change over time. In order to detect which memory cells are suffering from the occurrence of fast detrapping, the written data may be read out after allowing a predetermined time to pass from writing to allow for the completion of any detrapping.

FIG. 8C illustrates an instance of reading the data using the read level 11 threshold voltage and separately reading the data using an identify level threshold voltage ζ. Based on a comparison of the two reads, memory cells on word line i suffering from fast detrapping 816 may be identified. For example, if a cell's threshold voltage is between η and ζ, this cell may be identified as suffering from fast detrapping and the encoder module 410 may obtain the location of this cell. In some instances, the identify voltage level ζ may correspond to the verify level threshold voltage v. As noted above, the amount of detrapping for each memory cell may be different and change over time. Accordingly, the identify voltage level ζ may be changed by taking into account the frequency at which detrapping is detected. For instance, the identify voltage level ζ may be modified upon the detection of a predetermined number of memory cells suffering from fast detrapping.

FIGS. 9A and 9B depict another example of threshold voltage distributions of memory cells in accordance with an embodiment of the present disclosure. The voltage distributions of the memory cells shown in FIGS. 9A and 9B may correspond to the memory cells in an initialized or erased state prior to writing the data in block 512 of FIG. 5. FIG. 9A illustrates a first word line i 910 comprising memory cells $C_{(i,j-1)}$ 912, $C_{(i,j)}$ 914, and $C_{(i,j+1)}$ 916. The first word line i 910 may correspond to the word line described above and shown in FIG. 6A. FIG. 9A further illustrates a threshold voltage distribution 918 of the memory cells in the first word line i 910. FIG. 9B illustrates a second word line i−1 950 comprising memory cells $C_{(i-1,j-1)}$ 952, $C_{(i-1,j)}$ 954, and $C_{(i-1,j+1)}$ 956 in a first state. In this first state, the memory cells of word line i−1 have a threshold voltage distribution 958.

FIGS. 10A and 10B depict an example of threshold voltage distributions of memory cells in accordance with an embodiment of the present disclosure. In particular, FIGS. 10A and 10B depict an example of threshold voltage distributions corresponding to the writing to the word line i−1 950 shown in FIG. 9B. This may correspond to writing the data in block 512 of FIG. 5. FIG. 10A shows a first word line i 1010 comprising memory cells $C_{(i,j-1)}$ 1012, $C_{(i-1,j)}$ 1014, and $C_{(i,j+1)}$ 1016. FIG. 10A further illustrates a threshold voltage distribution 1018 of the memory cells in the first word line i 1010. This voltage distribution may correspond to the voltage distribution 918 shown in FIG. 9A since the word line i 1010 is in the same first state.

FIG. 10B illustrates an example of writing data to a second word line i−1 1050. FIG. 10B shows the second word line i−1 1050 comprising memory cells $C_{(i-1,j-1)}$ 1052, $C_{(i-1,j)}$ 1054, and $C_{(i-1,j+1)}$ 1056. The word line i−1 1050 of FIG. 10B may correspond to the word line i−1 950 shown in FIG. 9B. As shown in FIG. 10B, the word line i−1 shifts from a first threshold voltage distribution 1058 to a second threshold voltage distribution 1060 due to the injection of charges into the memory cells $C_{(i-1,j-1)}$ 1052, $C_{(i-1,j)}$ 1054, and $C_{(i-1,j+1)}$ 1056. FIG. 10B illustrates the voltage distribution 1060 immediately after writing the data and prior to the occurrence of fast detrapping.

Figure 11A:
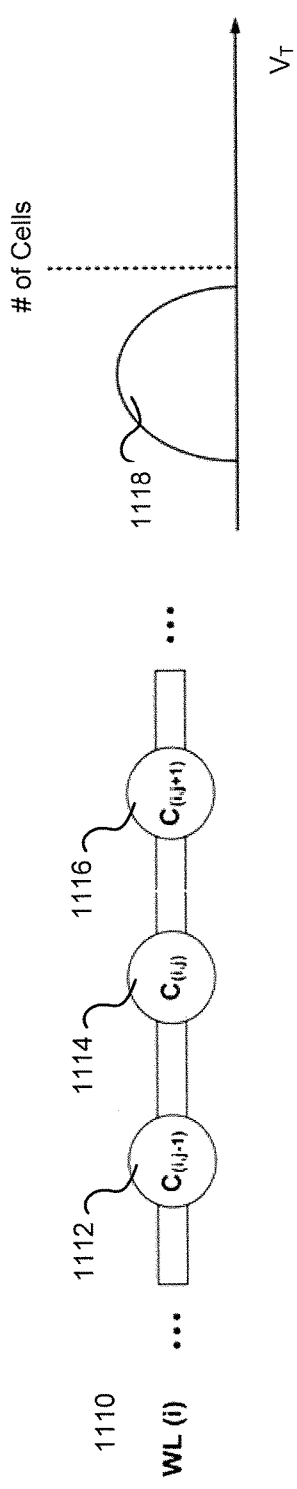
FIGS. 11A and 11B depict an example of threshold voltage distributions of memory cells in accordance with an embodiment of the present disclosure.
Figure 11B:
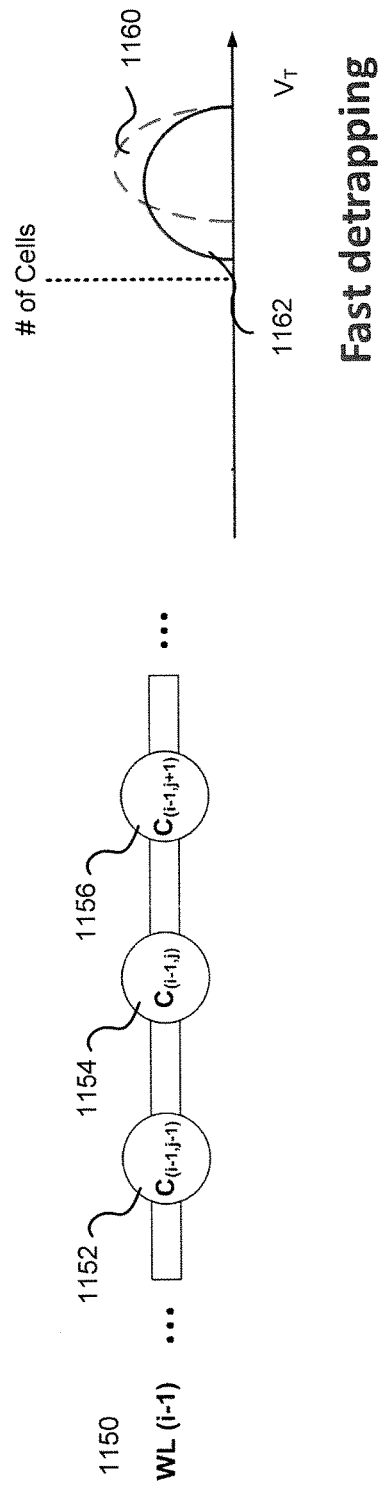

FIGS. 11A and 11B depict an example of threshold voltage distributions of memory cells in accordance with an embodiment of the present disclosure. In particular, FIGS. 11A and 11B depict an example of threshold voltage distributions just after writing to the word line i−1 1050 shown in FIG. 10B. This may correspond to writing the data in block 512 of FIG. 5. FIG. 11A shows a first word line i 1110 comprising memory cells $C_{(i,j-1)}$ 1112, $C_{(i,j)}$ 1114, and $C_{(i,j+1)}$ 1116. FIG. 11A further illustrates a threshold voltage distribution 1118 of the memory cells in the first word line i 1110. This voltage distribution may correspond to the voltage distribution 918 shown in FIG. 9A and the voltage distribution 1018 shown in FIG. 10A.

FIG. 11B illustrates an example of fast detrapping of occurring on a second word line i−1 1150. FIG. 10B shows the second word line i−1 1150 comprising memory cells $C_{(i-1,j-1)}$ 1152, $C_{(i-1,j)}$ 1154, and $C_{(i-1,j+1)}$ 1156. The word line i−1 1150 of FIG. 10B may correspond to the word line i−1 950 shown in FIG. 9B and the word line i−1 1050 shown in FIG. 10B. As shown in FIG. 11B, the voltage distribution 1160 of the memory cells on word line i−1 1150 is shifted due to fast detrapping. The fast detrapping is caused by electrons tunneling out from the memory cells such that its voltage distribution of the memory cells is changes.

Figure 12A:
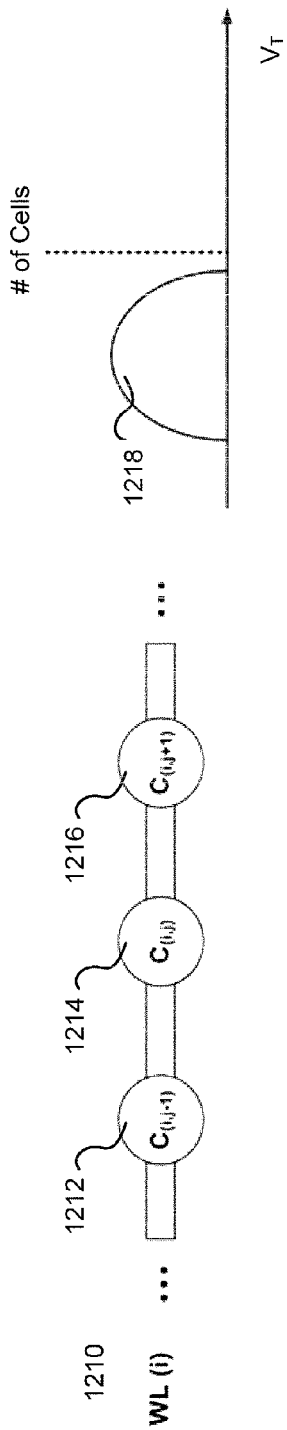
FIGS. 12A and 12B depict an example of threshold voltage distributions of memory cells in accordance with an embodiment of the present disclosure.
Figure 12B:
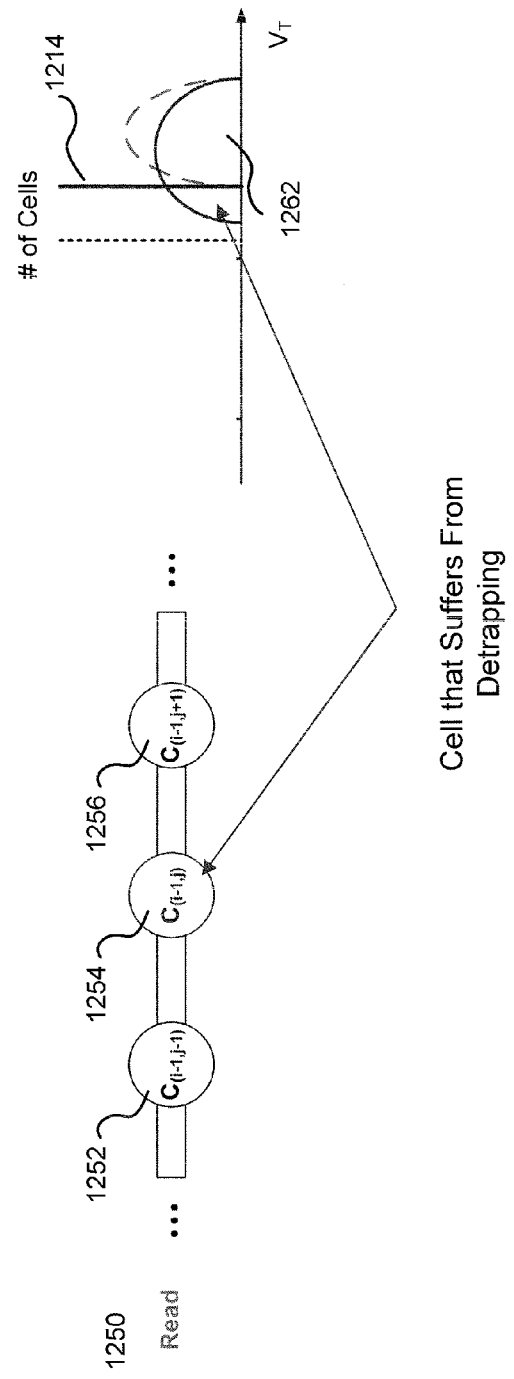

FIGS. 12A and 12B depict an example of threshold voltage distributions of memory cells in accordance with an embodiment of the present disclosure. In particular, FIGS. 12A and 12B depict an example of threshold voltage distributions while reading word line i−1 1250. Word line i−1 1250 may correspond to the word line i−1 1150 shown in FIG. 11B. The reading of word line i−1 1250 may also correspond to reading data in block 514 and analyzing the data of block 516 of FIG. 5. FIG. 12A shows a first word line i 1210 comprising memory cells $C_{(i,j-1)}$ 1212, $C_{(i,j)}$ 1214, and $C_{(i,j+1)}$ 1216. FIG. 12A further illustrates a threshold voltage distribution 1218 of the memory cells in the first word line i 1210. This voltage distribution may correspond to the voltage distribution 1118 shown in FIG. 11A.

FIG. 12B illustrates an example of reading data previously written to the memory cells $C_{(i-1,j-1)}$ 1252, $C_{(i-1,j)}$ 1254, and $C_{(i-1,j+1)}$ 1256 on word line i−1 1250 to determine whether fast detrapping has occurred. In some instances, the data from word line i−1 1250 may be read using a threshold voltage 1214. This data read may then be compared to a stored copy of the data to identify any errors. In this instance, it may be determined that cell $C_{(i-1,j)}$ 1254 suffers from fast detrapping since the voltage distribution at that cell has fallen below the threshold voltage 1214. For example, the controller 320 may store a copy of the data and compare that to the data read. In another instance, the data from word line i−1 1250 may be read using a read threshold voltage (not illustrated) and another threshold voltage 1214 corresponding to a verification voltage. Based on a comparison of the two reads using the different threshold voltages, it may be determined that cell $C_{(i-1,j)}$ 1254 suffers from detrapping since its voltage distribution is below the threshold voltage 1214 but above the read threshold voltage (not illustrated).

Figure 13A:
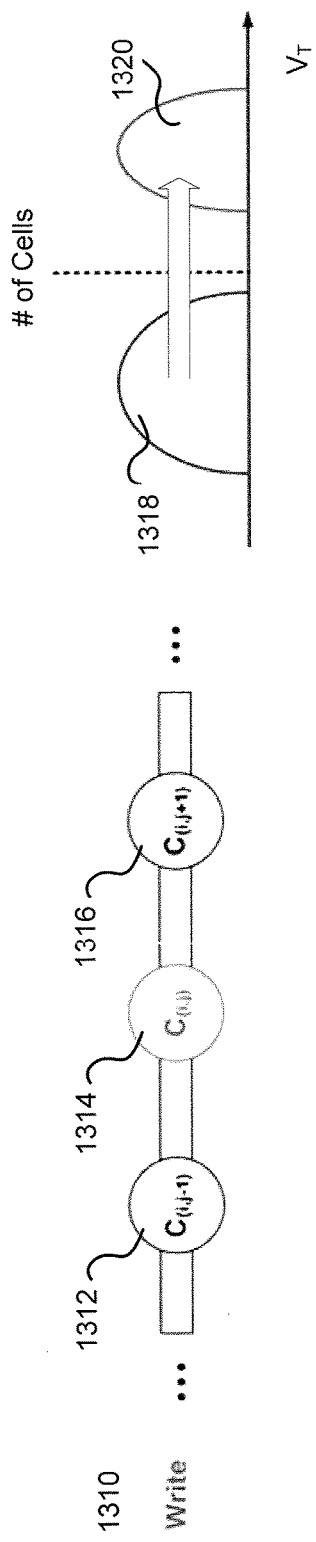
FIGS. 13A and 13B depict an example of threshold voltage distributions of memory cells in accordance with an embodiment of the present disclosure.
Figure 13B:
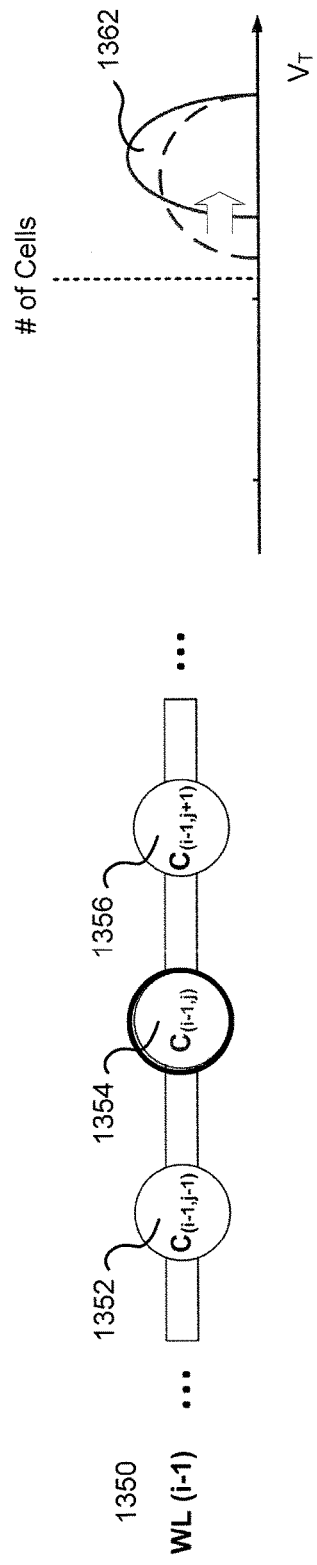

FIGS. 13A and 13B depict an example of threshold voltage distributions of memory cells in accordance with an embodiment of the present disclosure. In particular, FIGS. 13A and 13B depict an example of threshold voltage distributions while writing to word line i 1310. In particular, FIGS. 13A and 13B shows an example of encoding and writing data corresponding to blocks 518 and 520 of FIG. 5. FIG. 13A illustrates word line i 1310 comprising memory cells $C_{(i,j-1)}$ 1312, $C_{(i,j)}$ 1314, and $C_{(i,j+1)}$ 1316. Word line i 1310 corresponds to word line i 1210 of FIG. 12A. FIG. 13B shows word line i−1 1350 comprising cells $C_{(i-1,j-1)}$ 1352, $C_{(i-1,j)}$ 1354, and $C_{(i-1,j+1)}$ 1356. Word line i−1 1350 corresponds to word line i−1 1250 of FIG. 12B.

In this instance, cell $C_{(i-1,j)}$ 1354 suffers from fast detrapping. Accordingly, data may be encoded (e.g., mapped) to memory cell $C_{(i,j)}$ 1314 of word line i 1310 which is adjacent to the cell $C_{(i-1,j)}$ 1354 in word line i−1 1350 to cause intentional ICI. FIG. 13B illustrates writing to word line i 1310 and in particular memory cell $C_{(i,j)}$ 1314 such that the threshold voltage distribution may shift from a first state 1318 to a second state 1320. As a result, charge may be injected into the cell $C_{(i-1,j)}$ due to the intentional ICI such that the voltage distribution may shift from a degraded distribution to a distribution 1362 which more accurately corresponds to the desired programming state.

Figure 14:
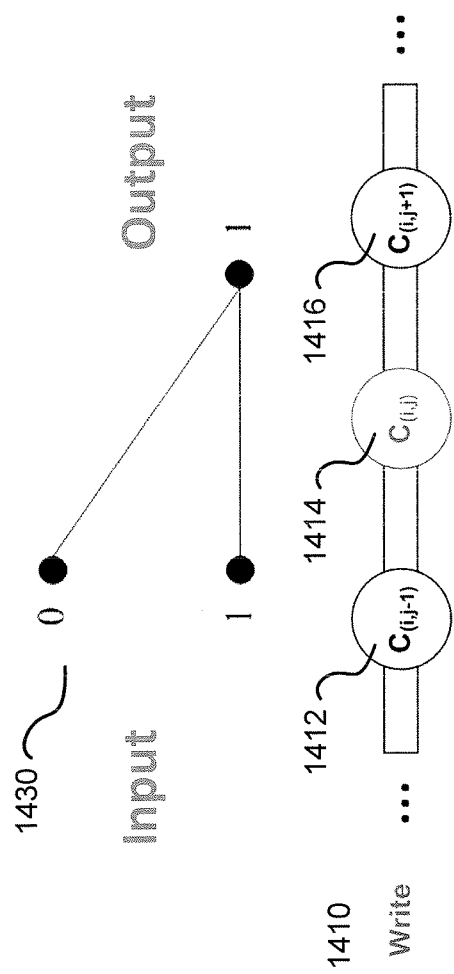
FIG. 14 depicts an example of an input/output concept of a memory cell in accordance with an embodiment of the present disclosure.

FIG. 14 depicts an example of an input/output concept of a memory cell in accordance with an embodiment of the present disclosure. Traditionally, a binary memory cell may be considered defective if its cell value is stuck-at a particular value (0 or 1) regardless of the channel input. This is illustrated 1410 in FIG. 14 showing input 0 and 1 outputting 1. Based on this concept, $C_{(i,j)}$ adjacent to the cell $C_{(i-1,j)}$ suffering from detrapping may be considered to be stuck according the an encoding scheme of the present disclosure. For example, if the coding scheme requires that voltages exceeding the threshold correspond to "0," then $C_{(i,j)}$ may be considered to be stuck at "0." Accordingly, when encoding new data to the memory, $C_{(i,j)}$ may be encoded as a "0" such that when the data is written voltage is injected into the cell and ICI increases the threshold voltage of cell (i−1, j) suffering from detrapping.

Figure 15:
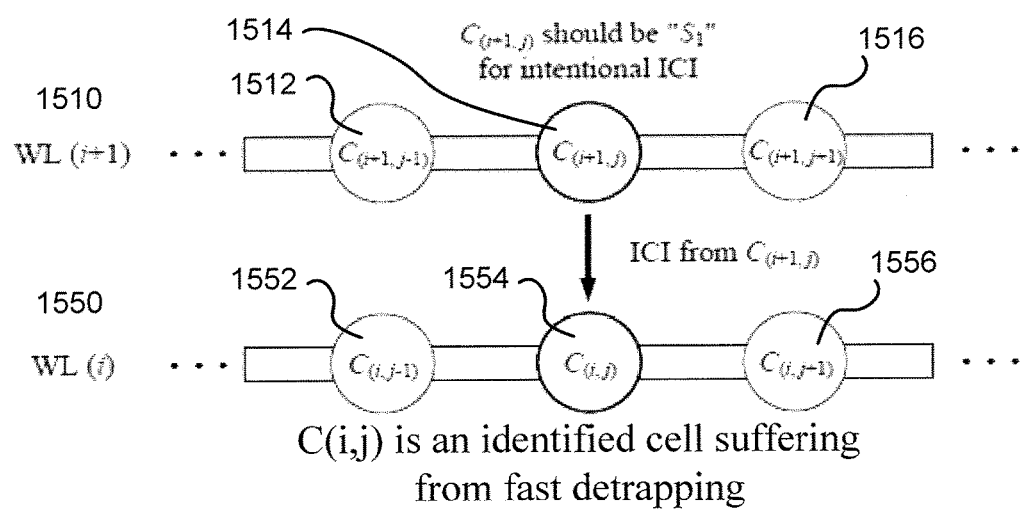
FIG. 15 depicts another example of inter-cell interference in accordance with an embodiment of the present disclosure.

FIG. 15 depicts another example of inter-cell interference in accordance with an embodiment of the present disclosure. In this example, FIG. 15 illustrates word line i+1 1510 comprising memory cells $C_{(i+1,j-1)}$ 1512, $C_{(i+1,j)}$ 1514, and $C_{(i+1,j+1)}$ 1516. FIG. 15 further word line i 1550 comprising memory cells $C_{(i,j-1)}$ 1552, $C_{(i,j)}$ 1554, and $C_{(i,j+1)}$ 156. In this instance, cell $C_{(i,j)}$ 1554 on word line i 1550 comprising has been identified as suffering from fast detrapping by reading out the word line as described above, Based on the identification of cell $C_{(i,j)}$ 1554 suffering from detrapping, data may be encoded and written to $C_{(i+1,j)}$ 1514 such that the threshold voltage of cell $C_{(i,j)}$ may increase due to the intentional ICI.

Figure 16:
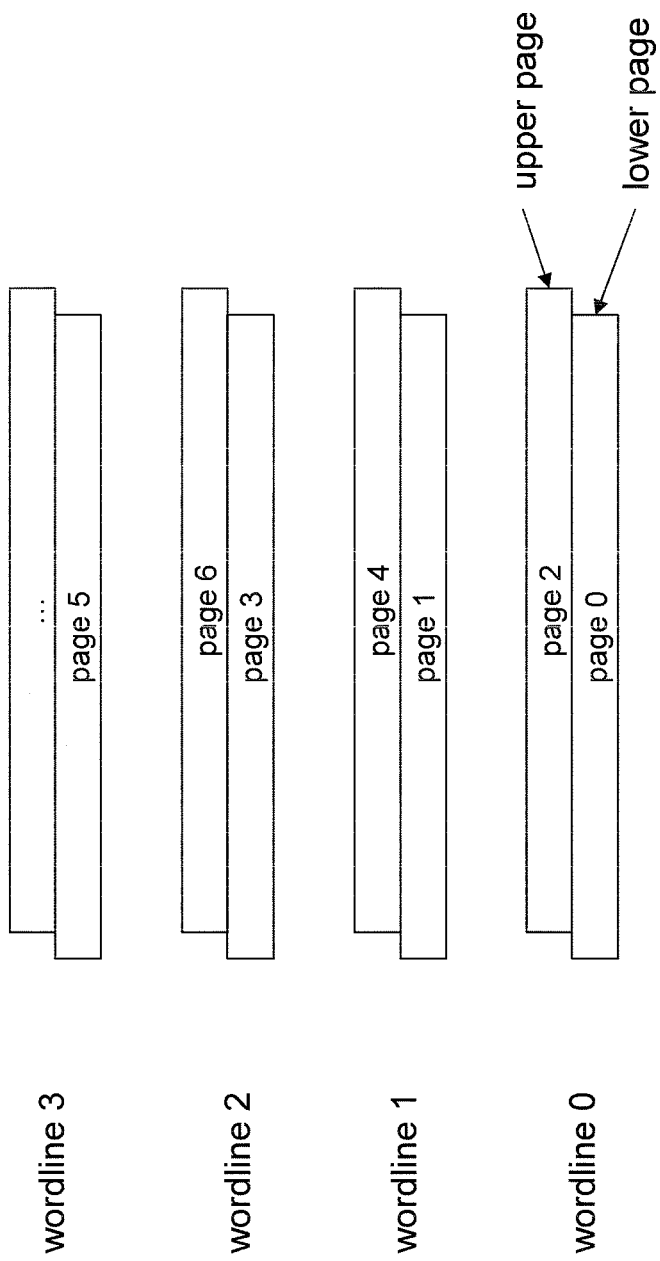
FIG. 16 depicts memory cells in accordance with an embodiment of the present disclosure.

FIG. 16 depicts memory cells in accordance with an embodiment of the present disclosure. In particular, FIG. 16 shows a plurality of word lines of a multi-level cell (MLC) memory. The multi-level cell memory is capable of storing multiple bits (e.g., two) per cell. MLC memory may be written by lower and upper pages in an all-bit-line (ALB) architecture such that all bit lines in one word line are programmed at once. Such a scheme is illustrated in FIG. 16 which shows one example of writing to the memory in the following order: 1) page 0 in lower page of word line 0; 2) page 1 in lower page of word line 1; 3) page 2 in upper page of word line 1; 4) page 3 in lower page of word line 2; 5) page 4 in upper page of word line 1, etc. According to embodiments of the present disclosure, intentional ICI may be implemented in this scheme when pages in adjacent word lines are written.

Figure 17:
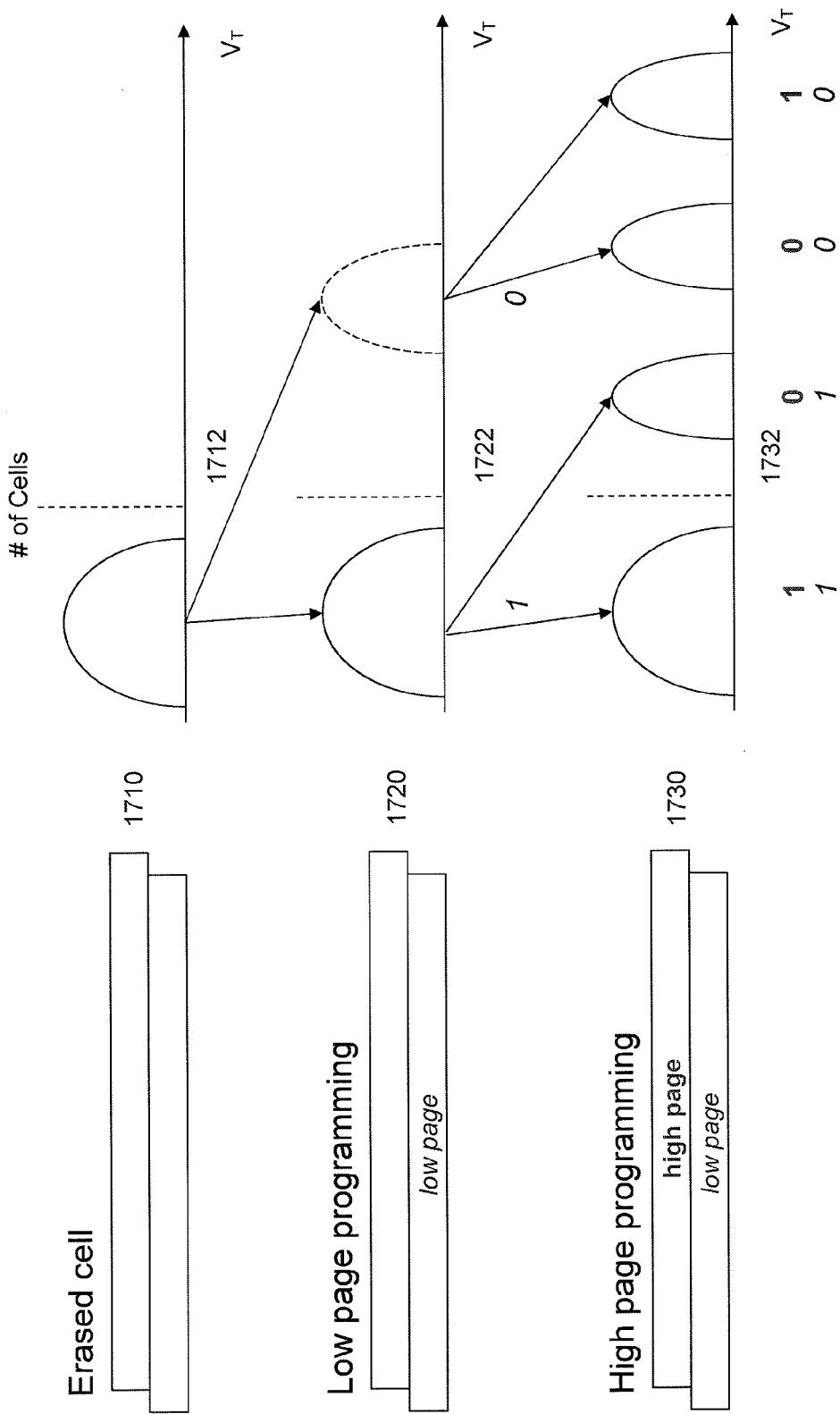
FIG. 17 depicts an example of threshold voltage distributions of memory cells in accordance with an embodiment of the present disclosure.

FIG. 17 depicts an example of threshold voltage distributions of memory cells in accordance with an embodiment of the present disclosure. In particular, FIG. 17 illustrates threshold voltage distributions of memory cells based on data to MLC memory according to the above-described scheme. As shown in FIG. 17, a word line having a lower page (low page) and an upper page (high page) may be initially in a first state 1710 that that its voltage distribution 1712 is an erased state. The word line may shift to a second state 1720 in which the lower page is programmed and provides a voltage distribution 1722 corresponding to a logical value 10. Subsequent to writing the lower page, the word line may shift to a third state 1730 in which the upper page (high page) is programmed and provides a voltage distribution 1732 corresponding to a logical value 1001 in the high page and 1100 in the low page.

Figure 18:
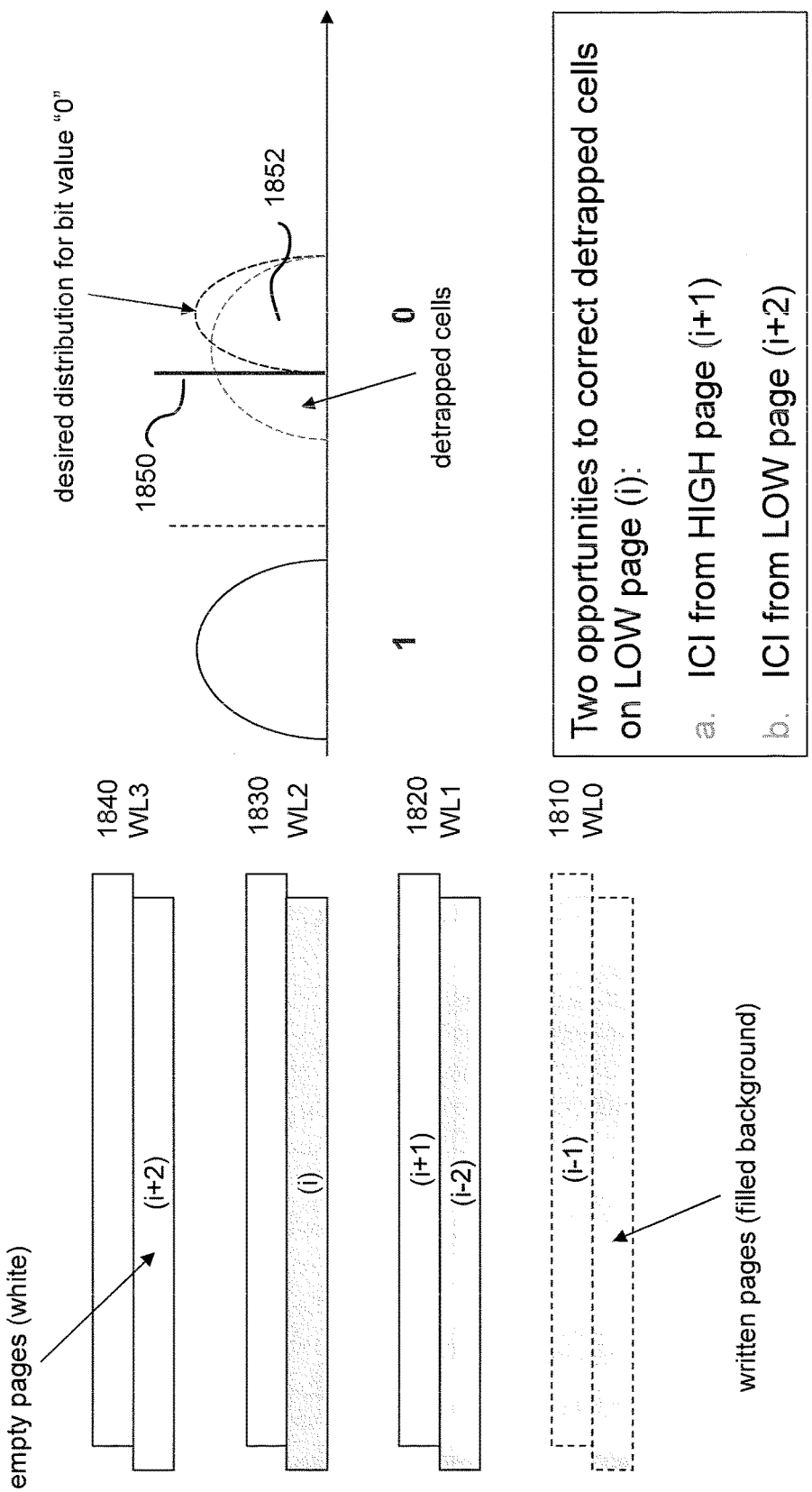
FIG. 18 depicts an example of threshold voltage distributions of memory cells in accordance with an embodiment of the present disclosure.

FIG. 18 depicts an example of threshold voltage distributions of memory cells in accordance with an embodiment of the present disclosure. In particular, FIG. 18 illustrates the opportunities for implementing intentional ICI to correct for detrapped cells on low page (i) of the word line. FIG. 18 illustrates multiple word lines: WL0 1810, WL1 1820, WL2 1830, and WL3 1840. Each word line having a lower page (low page) and an upper page (high page). In this instance, data has been written to both pages of WL0 1810, the lower page of WL1 1820, and the lower page (i) of WL2 1830. By reading back the data of the lower page (i) of WL2, it may be determined that cells on the lower page (i) suffer from detrapping. This may correspond to the step of reading the data and analyzing the data of blocks 514 and 516 of FIG. 5. In particular, reading back the data from the lower page (i) of WL2 1830 may indicate that a portion of the voltage distribution 1812 falls below the threshold voltage 1850. When writing subsequent data to the low page on WL3 1840 and the high page on WL1 1820, intentional ICI may be introduced to compensate for the detrapping.

Figure 19:
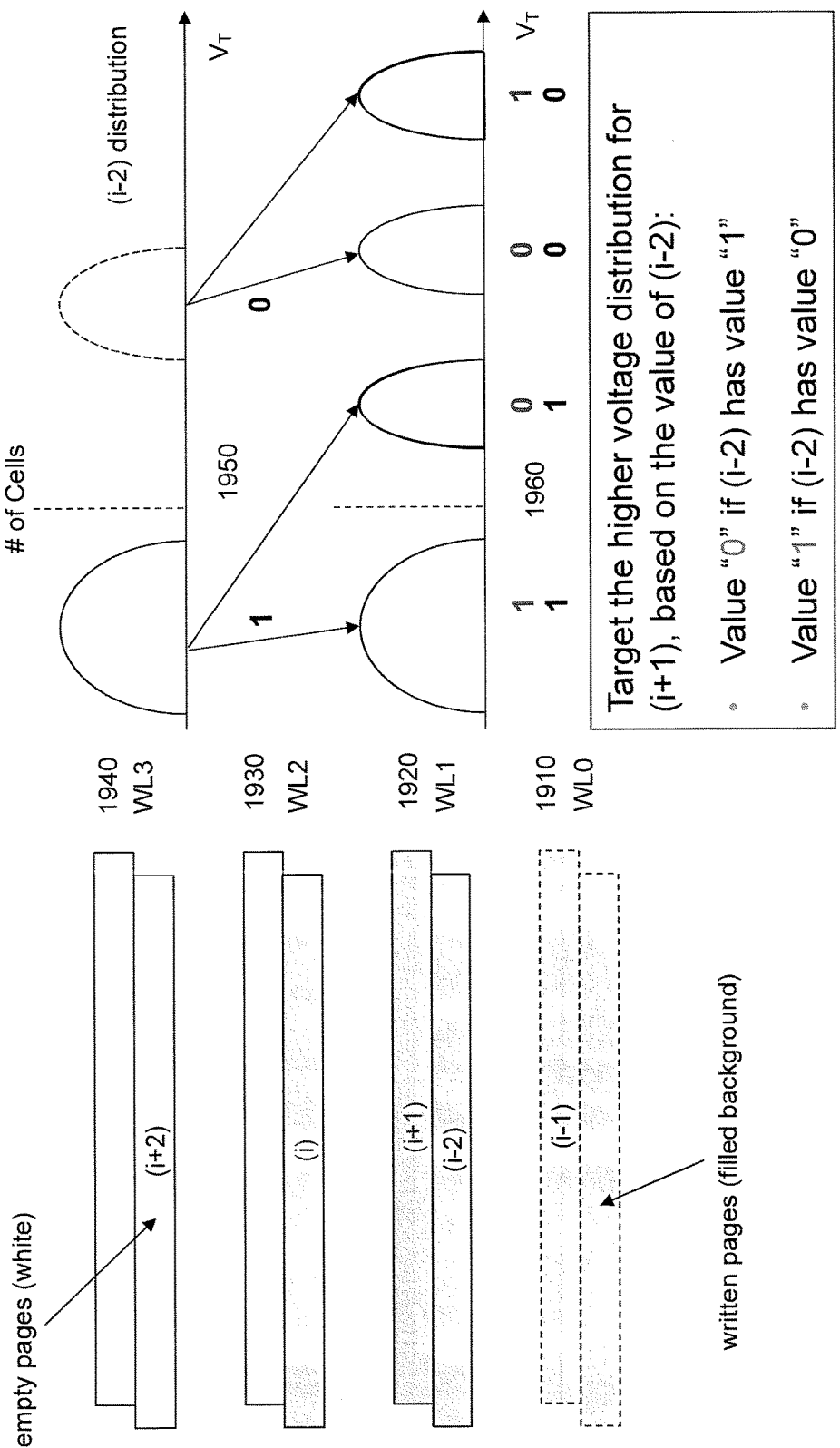
FIG. 19 depicts an example of threshold voltage distributions of memory cells in accordance with an embodiment of the present disclosure.

FIG. 19 depicts an example of threshold voltage distributions of memory cells in accordance with an embodiment of the present disclosure. FIG. 19 depicts word lines: WL0 1910, WL1 1920, WL2 1930, and WL3 1940 corresponding to the word lines of FIG. 18. As described above with respect to FIG. 18, lower page (i) of WL2 1820 has been determined to suffer from detrapping. FIG. 19 accordingly shows a first opportunity for intentional ICI by programming the upper page (i+1) on WL1 1920 to compensate for the detrapping of the lower page (i) of WL2 1930. However, in order to avoid causing undesired errors, the voltage distribution of (i−2) 1950 may be accounted for. For example, the voltage distribution of the lower page (i−2) of WL1 1920 may be taken into account when writing to the upper page (i+1) on WL1 1920 such that if (i−2) has a value of "1," then a value of "0" may be programmed while if (i−2) has a value of "0," then a value of "1" may be programmed. Accordingly, writing the upper page (i+1) on WL1 may increase the voltage of the lower page (i) on WL2 1920 leading to a voltage distribution 1960.

Figure 20:
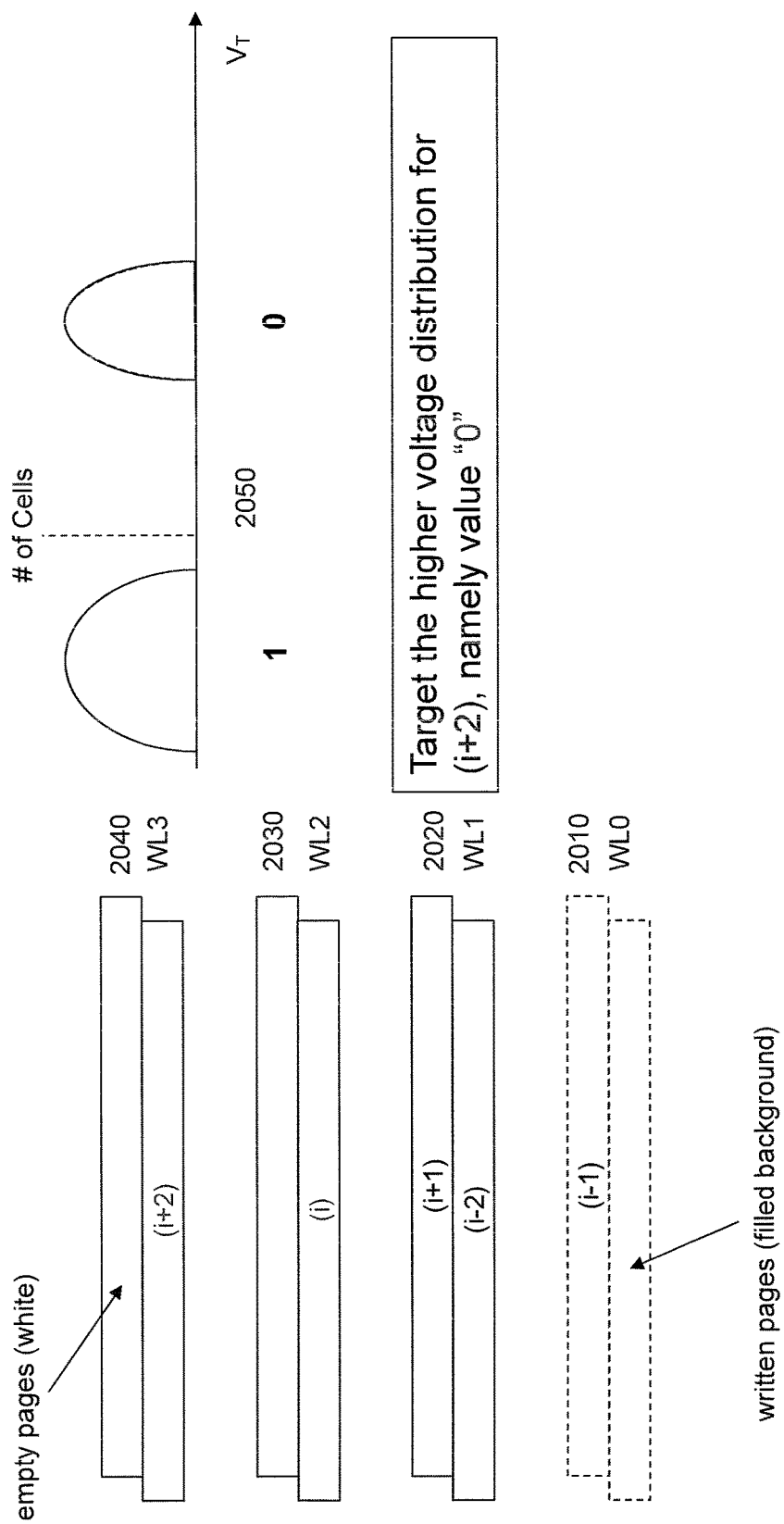
FIG. 20 depicts an example of threshold voltage distributions of memory cells in accordance with an embodiment of the present disclosure.

FIG. 20 depicts an example of threshold voltage distributions of memory cells in accordance with an embodiment of the present disclosure. FIG. 20 depicts word lines: WL0 2010, WL1 2020, WL2 2030, and WL3 2040 corresponding to the word lines of FIGS. 18 and 19. In this instance, FIG. 20 shows a second opportunity for intentional ICI by programming the lower page (i+2) on WL3 to compensate for the detrapping of the lower page (i) of WL2. Data to be written may be encoded such that the lower page (i+2) on WL3 is programmed to a higher voltage distribution (e.g., "0"). Accordingly, the threshold voltage distribution 2050 of the lower page (i) of WL2 may be increased.

Figure 21:
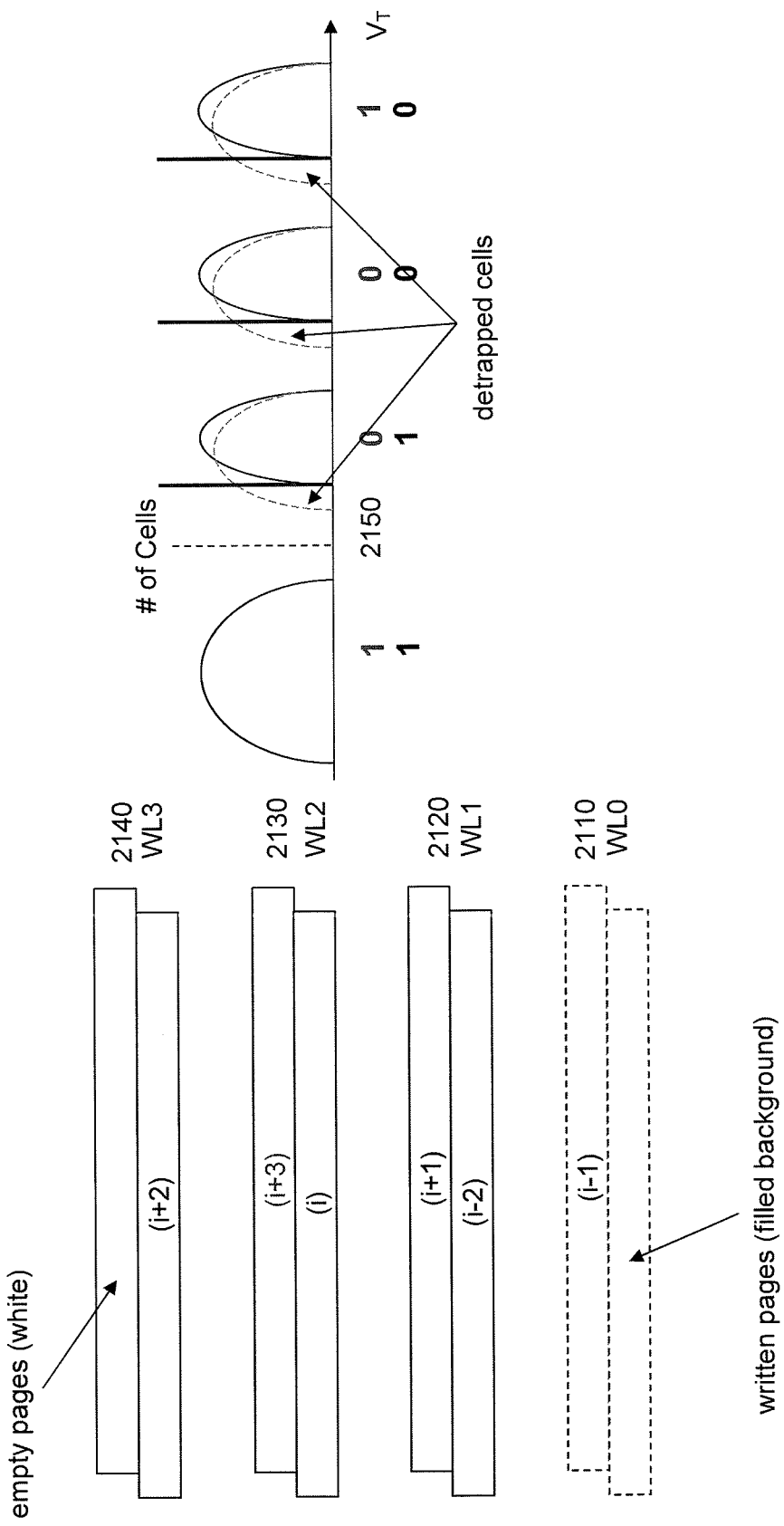
FIG. 21 depicts an example of threshold voltage distributions of memory cells in accordance with an embodiment of the present disclosure.

FIG. 21 depicts an example of threshold voltage distributions of memory cells in accordance with an embodiment of the present disclosure. FIG. 21 depicts word lines: WL0 2110, WL1 2120, WL2 2130, and WL3 2140 corresponding to the word lines of FIGS. 18-20. In this instance, FIG. 21 shows a shift if a voltage distribution of the memory cells on the upper page (i+3) of WL2 2130 due to the occurrence of fast detrapping. Accordingly, the upper page (i+3) contains errors.

Figure 22:
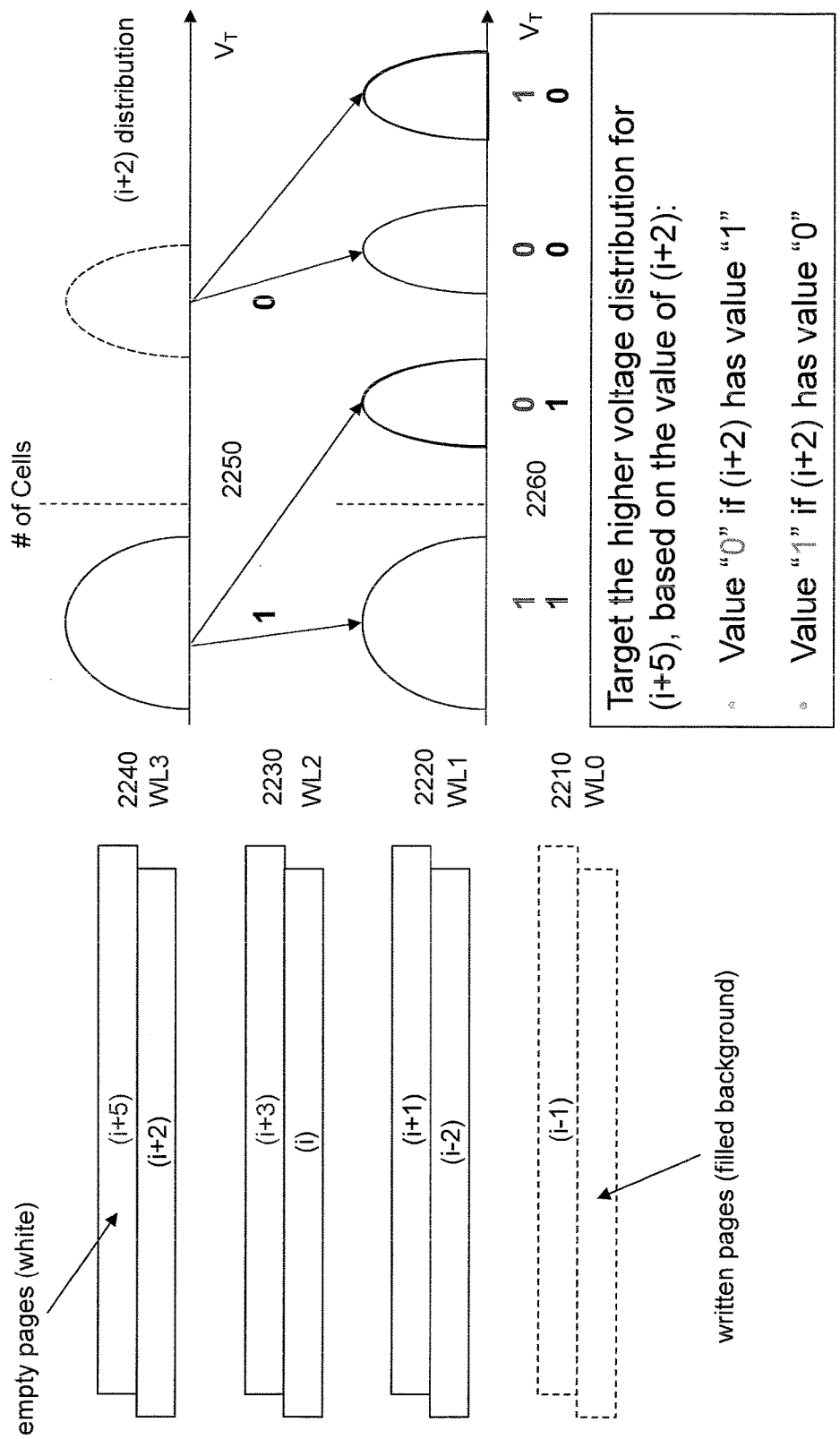
FIG. 22 depicts an example of threshold voltage distributions of memory cells in accordance with an embodiment of the present disclosure.

FIG. 22 depicts an example of threshold voltage distributions of memory cells in accordance with an embodiment of the present disclosure. FIG. 22 depicts word lines: WL0 2210, WL1 2220, WL2 2230, and WL3 2240 corresponding to the word lines of FIGS. 18-21. FIG. 22 shows the implementation of intentional ICI in writing data to the upper page (i+5) of WL3 to compensate for the detrapping in the upper page (i+3) of WL2 as described above with respect to FIG. 21. Data to be written to empty page (i+5) of WL3 may be encoded taking into account the values written to the lower page (i+2) of WL3 such that if the lower page (i+2) has a value of "1," a value of "0" is encoded or if the lower page (i+2) has a value of "0," a value of "1" is encoded. Accordingly, the threshold voltage of the upper page (i+3) of WL2 may be increased due to the ICI intentionally encoded into the upper page (i+5) of WL3.

Other embodiments are within the scope and spirit of the invention. For example, the functionality described above can be implemented using software, hardware, firmware, hardwiring, or combinations of any of these. One or more computer processors operating in accordance with instructions may implement the functions associated with encoding data for NVM storage systems in accordance with the present disclosure as described above. If such is the case, it is within the scope of the present disclosure that such instructions may be stored on one or more non-transitory processor readable storage media (e.g., a magnetic disk or other storage medium). Additionally, modules implementing functions may also be physically located at various positions, including being distributed such that portions of functions are implemented at different physical locations.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of encoding data for writing to a memory comprising:
    writing first data to a plurality of memory cells in the memory of a 3d arrangement;
    reading the first data from the plurality of memory cells in the memory;
    analyzing the first read data to determine whether the first read data includes an error indicative of a defect in one of the plurality of memory cells;
    when one of the plurality of memory cells is defective, encoding distinct second data based on a location of the defective one of the plurality of memory cells; and
    writing the encoded second data to the memory, wherein writing the encoded second data to the memory comprises writing at least a part of the encoded second data to a memory cell that is immediately next to the defective one of the plurality of memory cells to intentionally cause inter-cell interference to the defective one of the plurality of memory cells to increase a threshold voltage in the interfering cell, wherein the three-dimensional flash memory comprises a plurality of word lines having multi-level cells, wherein the encoded second data is written to one of an upper page of a first adjacent word line different from a word line containing the first data and a lower page of a second adjacent word line different from the word line containing the first data.

2. The method of claim 1, wherein the memory is a non-volatile memory storage system.

3. The method of claim 2, wherein the non-volatile memory storage system is a solid state drive.

4. The method of claim 3, wherein the solid state drive is three-dimensional flash memory.

5. The method of claim 1, wherein the reading comprises reading the first data from the memory based on a predetermined threshold.

6. The method of claim 5, wherein the predetermined threshold is a read voltage level threshold.

7. The method of claim 6, wherein the analyzing comprises comparing the first data read from the memory to a copy of the first data different from the first data stored in the memory.

8. The method of claim 1, wherein the adjacent memory cell is in a different word line compared to the defective one of the plurality of memory cells.

9. The method of claim 1, wherein the reading comprises reading the first data from the memory based on a plurality of predetermined thresholds.

10. The method of claim 9, wherein the analyzing comprises comparing the first data read from the memory based on a first of the plurality of predetermined thresholds and the first data read from the memory based on a second of the plurality of predetermined thresholds that is different from the first predetermined threshold.

11. The method of claim 1, wherein the encoding is performed by a flash memory controller.

12. The method of claim 1, wherein the error is caused by detrapping.

13. The method of claim 1, wherein the second data is written to memory at the position to cause inter-cell interference with the first data.

14. A non-transitory computer program product comprised of a series of instructions executable on a computer, the series of instructions operable to perform a process for encoding data for writing to a memory; the series of instructions implementing the steps of:
  writing first data to a plurality of memory cells in the memory of a 3d arrangement;
  reading the first data from the plurality of memory cells in the memory;
  analyzing the read first data to determine whether the first read data includes an error indicative of a defect in one of the plurality of memory cells;
  when one of the plurality of memory cells is defective, encoding distinct second data based on a location of the defective one of the plurality of memory cells; and
  writing the encoded second data to the memory, wherein writing the encoded second data to the memory comprises writing at least a part of the encoded second data to a memory cell that is immediately next to the defective one of the plurality of memory cells to intentionally cause inter-cell interference to the defective one of the plurality of memory cells to increase a threshold voltage in the interfering cell, wherein the three-dimensional flash memory comprises a plurality of word lines having multi-level cells, wherein the encoded second data is written to one of an upper page of a first adjacent word line different from a word line containing the first data and a lower page of a second adjacent word line different from the word line containing the first data.

15. A system for encoding data for writing to a memory, the system comprising:
  a writing module configured to write first data to a plurality of memory cells in the memory of a 3d arrangement;
  a reading module configured to read the first data from the plurality of memory cells in the memory;
  an analyzing module configured to analyze the first read data to determine whether the first read data includes an error indicative of a defect in one of the plurality of memory cells;
  an encoding module configured to encode distinct second data based on a location of the defective one of the plurality of memory cells; and
  an encoded data writing module configured to write the encoded second data to the memory, wherein writing the encoded second data to the memory comprises writing at least a part of the encoded second data to a memory cell that is immediately next to the defective one of the plurality of memory cells to intentionally cause inter-cell interference to the defective one of the plurality of memory cells to increase a threshold voltage in the interfering cell, wherein the three-dimensional flash memory comprises a plurality of word lines having multi-level cells, wherein the encoded second data is written to one of an upper page of a first adjacent word line different from a word line containing the first data and a lower page of a second adjacent word line different from the word line containing the first data.

16. The system of claim 15, wherein the encoding module comprises a flash memory controller.

* * * * *